United States Patent
Zhang et al.

(10) Patent No.: US 10,613,125 B2
(45) Date of Patent: Apr. 7, 2020

(54) CONNECTION JOINTS FROM 3-PHASE TO SINGLE-PHASE ON MODULAR METERING MAIN BUS

(71) Applicant: Siemens Industry, Inc., Alpharetta, GA (US)

(72) Inventors: Fan Zhang, Suwanee, GA (US); Brian J. Rusch, Suwanee, GA (US); Arthur Kevin Shumate, Duluth, GA (US)

(73) Assignee: SIEMENS INDUSTRY, INC., Alpharetta, GA (US)

( * ) Notice: Subject to any disclaimer, the term of this patent is extended or adjusted under 35 U.S.C. 154(b) by 641 days.

(21) Appl. No.: 15/165,879

(22) Filed: May 26, 2016

(65) Prior Publication Data

US 2017/0343592 A1 Nov. 30, 2017

(51) Int. Cl.
*H02B 1/20* (2006.01)
*G01R 21/133* (2006.01)
*H02B 1/22* (2006.01)
*H02B 1/16* (2006.01)
*H02B 1/24* (2006.01)

(52) U.S. Cl.
CPC ............. *G01R 21/133* (2013.01); *H02B 1/16* (2013.01); *H02B 1/22* (2013.01); *H02B 1/24* (2013.01)

(58) Field of Classification Search
None
See application file for complete search history.

(56) References Cited

U.S. PATENT DOCUMENTS

| | | | | | |
|---|---|---|---|---|---|
| 3,628,097 | A | * | 12/1971 | Kobryner | G01R 11/04 361/660 |
| 4,112,249 | A | * | 9/1978 | Carlson | H02G 5/007 174/68.2 |
| 5,936,834 | A | * | 8/1999 | Polston | H02B 1/20 361/660 |
| 7,285,724 | B2 | * | 10/2007 | Buettner | H02G 5/025 174/68.2 |
| 8,223,476 | B2 | * | 7/2012 | Zhang | H02B 1/20 174/54 |
| 9,641,092 | B2 | * | 5/2017 | Koyano | H02M 5/293 |
| 2009/0251852 | A1 | * | 10/2009 | Zhang | H02B 1/03 361/660 |

(Continued)

*Primary Examiner* — Courtney L Smith

(57) ABSTRACT

A 3-phase group modular metering system, with a 3-phase four main cross bus A, B, C and N configuration is provided to distribute 3-phase four wire power to a single-phase three main cross bus A1, B1 and N1 configuration as single-phase three wire power. The system comprises a 3-phase main connection module, at least one or more single-phase in to single-phase out metering module stacks, a number of 3-phase metering module stacks ranging from as few as none to as many as a plurality and a connection joint. The connection joint is disposed between a last 3-phase module and the at least one or more single-phase in to single-phase out metering module stacks to derive the 3-phase four main cross bus A, B, C and N configuration into the single-phase three main cross bus of A1, B1 and N1 configuration. The connection joint distributes power in single-phase through the single-phase three main cross bus of A1, B1 and N1 configuration by deriving (A, B, N) or (A, C, N) or (B, C, N) combination of a 3-phase bus and forming single-phase connection interfaces.

10 Claims, 14 Drawing Sheets

(56) References Cited

U.S. PATENT DOCUMENTS

| | | | | |
|---|---|---|---|---|
| 2011/0083872 A1* | 4/2011 | Zhang | ............... | H02G 5/025 |
| | | | | 174/50 |
| 2014/0098470 A1* | 4/2014 | Robinson | ............... | H02B 1/03 |
| | | | | 361/644 |
| 2015/0229232 A1* | 8/2015 | Bank | ............... | H02J 3/44 |
| | | | | 363/140 |
| 2015/0276890 A1* | 10/2015 | Turner | ............... | G01R 31/40 |
| | | | | 324/764.01 |
| 2015/0315786 A1* | 11/2015 | Callahan | ............... | F21S 8/043 |
| | | | | 52/652.1 |
| 2015/0323582 A1* | 11/2015 | Pigeon | ............... | H04B 3/54 |
| | | | | 324/86 |
| 2015/0323604 A1* | 11/2015 | Klapper | ............... | G01R 27/205 |
| | | | | 324/424 |
| 2016/0028275 A1* | 1/2016 | Kamel | ............... | H02J 13/0006 |
| | | | | 700/295 |
| 2016/0065090 A1* | 3/2016 | Dent | ............... | H02M 7/54 |
| | | | | 363/102 |
| 2016/0131688 A1* | 5/2016 | Carlson | ............... | G01R 21/133 |
| | | | | 702/61 |
| 2016/0251956 A1* | 9/2016 | Parra | ............... | E21B 43/128 |
| | | | | 340/854.9 |
| 2016/0322818 A1* | 11/2016 | Malengret | ............... | G06Q 50/06 |
| 2016/0349311 A1* | 12/2016 | Hayashi | ............... | G01R 31/2829 |
| 2016/0380432 A1* | 12/2016 | Bronsthein | ............... | H02J 3/26 |
| | | | | 307/147 |
| 2017/0012423 A1* | 1/2017 | Arritt | ............... | H02H 3/253 |

* cited by examiner

CONNECTION JOINTS FROM 3-PHASE TO SINGLE-PHASE ON MODULAR METERING MAIN BUS

BACKGROUND

1. Field

Aspects of the present invention generally relate to an interface for connecting a 3-phase configuration to a single-phase configuration and more specifically relates to distributing 3-phase four wire power from a 3-phase four main cross bus configuration to single-phase three wire power in a single-phase three main cross bus configuration.

2. Description of the Related Art

Utility companies transfer electrical power in three phases (A, B, and C phase) of alternating current (AC) power which are synchronized and offset from each other by 120 degrees. The three phase power is transferred over three wire lines, in addition to a ground or neutral wire, to transformers, which converts the power to lower distribution voltages. A main service panel then distributes single phase electrical power (AB, BC, or AC) to each tenant or customer.

In North American electrical systems, three-phase power is most commonly provided by the electric utility in a wye configuration to multifamily residential buildings and facilities to power both three-phase loads and 120 volt single-phase loads. The main advantage to wye power is that the phase-to-neutral voltage is equal on all three legs, which provide 208 volt between phase to phase and 120 volt between phase to neutral. Majority of residential tenants are operated on single phase services, which are almost always derived from two of the 3 phase wye system to provide 208Y/120 power.

Currently, group metering that is used to distribute electrical power to tenants accepts 3-phase input and output single-phase power while the metering modules selectively connect to two of the 3-phase line (U.S. Pat. No. 8,223,476), that requires all the group metering equipment have a 3-phase connection interface. Therefore 3-phase in and single phase out metering modules are required when the main line is in 3-phase.

Typically, a 3-phase group metering system has 4 main bus, marking as A, B, C and N to distribute 3 phase 4 wire power, while a single-phase group metering system has 3 main bus, marking as A, B, and N (use A1, B1 and N1 to differenciate 3 phase name letters forward) to distribute single-phase 3 wire power.

There are two types of modular meter stacks, three-phase in to single-phase out and single-phase in to single-phase out. The single-phase in and single-phase out metering modules are about 10% to 20% cheaper than same number of meter positions of 3-phase in to single-phase out metering modules.

Therefore, there is a need for improvements in a 3-phase system such as a 3-phase group metering system distributing single-phase 3 wire power while using modular meter stacks.

SUMMARY

Briefly described, aspects of the present invention relate to a mechanism for using single-phase in to single-phase out metering modules in a 3-phase group metering system. In particular, it relates to connection joints for distributing power from 3-phase to single-phase on a modular metering main bus. One of ordinary skill in the art appreciates that such a connection interface system can be configured to be installed in different systems where derivation of 3-phase 4 wire power into single-phase 3 wire power is needed, for example, in a 3-phase group metering system using single-phase in to single-phase out modular meter stacks.

In accordance with one illustrative embodiment of the present invention, a 3-phase group modular metering system is provided. The 3-phase group modular metering system, with a 3-phase four main cross bus A, B, C and N configuration is provided to distribute 3-phase four wire power to a single-phase three main cross bus A1, B1 and N1 configuration as single-phase three wire power. The system comprises a 3-phase main connection module, at least one or more single-phase in to single-phase out metering module stacks, a number of 3-phase metering module stacks ranging from as few as none to as many as a plurality and a connection joint. The connection joint is disposed between a last 3-phase module and the at least one or more single-phase in to single-phase out metering module stacks to derive the 3-phase four main cross bus A, B, C and N configuration into the single-phase three main cross bus of A1, B1 and N1 configuration. The connection joint distributes power in single-phase through the single-phase three main cross bus of A1, B1 and N1 configuration by deriving (A, B, N) or (A, C, N) or (B, C, N) combination of a 3-phase bus and forming single-phase connection interfaces.

In accordance with another illustrative embodiment of the present invention, a first 3-phase to a single-phase connection joint is provided. The first 3-phase to a single-phase connection joint is configured to connect a 3-phase A, B and N from a 3-phase four main cross bus A, B, C and N configuration into a single-phase three main cross bus of A1, B1 and N1 configuration for connecting a single-phase in to single-phase out metering module stack to a 3-phase module.

In accordance with yet another illustrative embodiment of the present invention, a second 3-phase to a single-phase connection joint is provided. The second 3-phase to a single-phase connection joint is configured to connect a 3-phase A, C and N from a 3-phase four main cross bus A, B, C and N configuration into a single-phase three main cross bus of A1, B1 and N1 configuration for connecting a single-phase in to single-phase out metering module stack to a 3-phase module.

In accordance with yet another illustrative embodiment of the present invention, a third 3-phase to a single-phase connection joint is provided. The third 3-phase to a single-phase connection joint is configured to connect a 3-phase B, C and N from a 3-phase four main cross bus A, B, C and N configuration into a single-phase three main cross bus of A1, B1 and N1 configuration for connecting a single-phase in to single-phase out metering module stack to a 3-phase module.

DETAILED DESCRIPTION

To facilitate an understanding of embodiments, principles, and features of the present invention, they are explained hereinafter with reference to implementation in illustrative embodiments. In particular, they are described in the context of being connection joint devices configured to interface a 3-phase system to a single-phase system to distribute 3-phase four wire power from a 3-phase module as single-phase three wire power to a single-phase in to single-phase out module such as a modular meter stack of a 3-phase group modular metering system. An ability to derive (A, B, N) or (A, C, N) or (B, C, N) combination of 3-phase bus from a 3-phase four main cross bus A, B, C and N configuration by forming single-phase connection interfaces is provided. Embodiments of the present invention, however, are not limited to use in the described devices or methods.

The components and materials described hereinafter as making up the various embodiments are intended to be illustrative and not restrictive. Many suitable components and materials that would perform the same or a similar function as the materials described herein are intended to be embraced within the scope of embodiments of the present invention.

Figure 1:
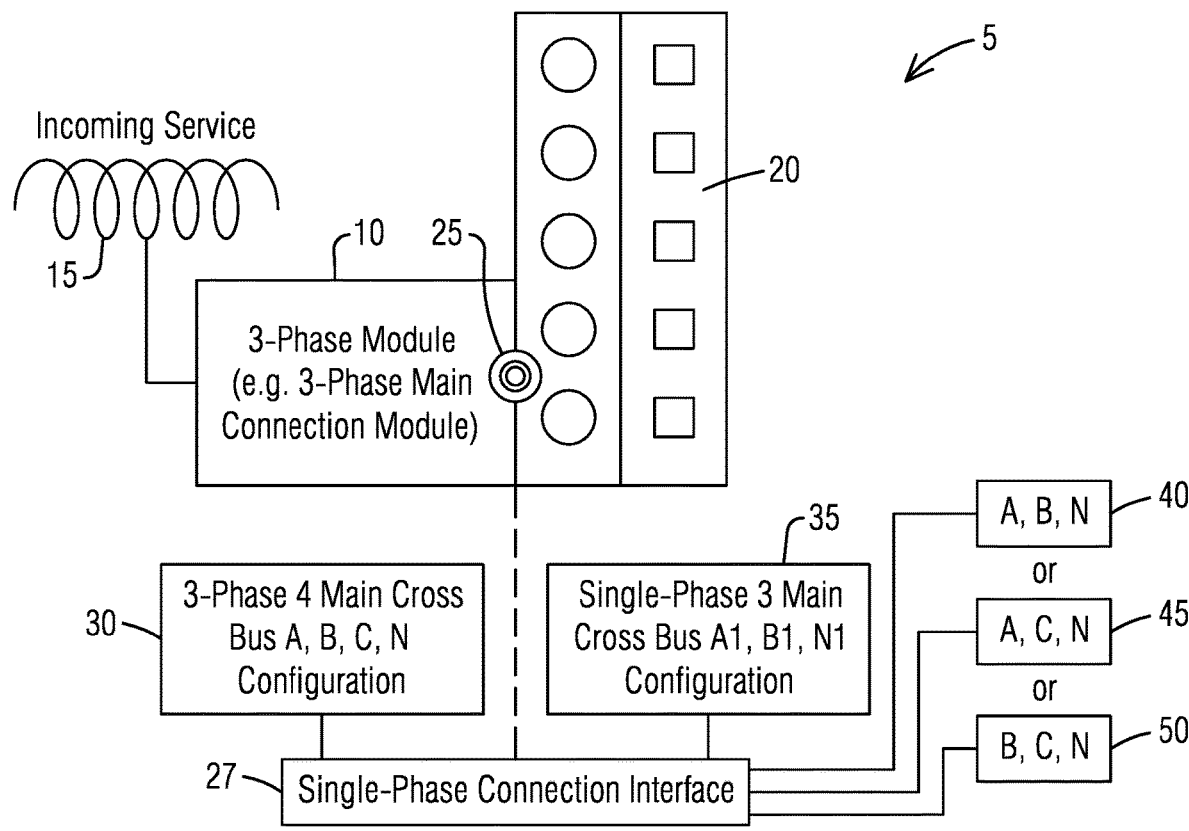
FIG. 1 illustrates a schematic view of a 3-phase group modular metering system including a 3-phase module providing 3-phase 4 wire power from an incoming service and a single-phase in to single-phase out module for distributing single-phase 3 wire power using a connection joint as a single-phase connection interface in accordance with an exemplary embodiment of the present invention.

Consistent with one embodiment of the present invention, FIG. 1 represents a schematic view of a 3-phase group modular metering system 5 including a 3-phase module 10 providing 3-phase 4 wire power from an incoming service 15 in accordance with an exemplary embodiment of the present invention. The 3-phase group modular metering system 5 further includes a single-phase in to single-phase out module 20 for distributing single-phase 3 wire power using a connection joint 25 as a single-phase connection interface 27. The 3-phase module 10 may be a 3-phase main connection module. The single-phase in to single-phase out module 20 may be one or more single-phase in to single-phase out metering module stacks. The 3-phase group modular metering system 5 may comprise a number of 3-phase metering module stacks (not shown) ranging from as few as none to as many as a plurality.

In the 3-phase group modular metering system 5, the connection joint 25 is configured to distribute 3-phase four wire power from a 3-phase four main cross bus A, B, C and N configuration 30 as single-phase three wire power to a single-phase three main cross bus A1, B1 and N1 configuration 35. The connection joint 25 may be disposed between a last 3-phase module such as the 3-phase module 10 and the single-phase in to single-phase out module 20 such as the single-phase in to single-phase out metering module stacks to derive the 3-phase four main cross bus A, B, C and N configuration 30 into the single-phase three main cross bus of A1, B1 and N1 configuration 35 for distributing power in single-phase through the single-phase three main cross bus of A1, B1 and N1 configuration 35 by deriving (A, B, N) 40 or (A, C, N) 45 or (B, C, N) 50 combination of a 3-phase bus. This derivation may be done by forming the single-phase connection interface 27.

The connection joint 25 derives the 3-phase four main cross bus A, B, C and N configuration 30 into the single-phase three main cross bus of A1, B1 and N1 configuration 35 by connecting the 3-phase four main cross bus A, B, C and N. The single-phase in to single-phase out module 20 such as the single-phase in to single-phase out metering module stack is disposed adjacent to the last 3-phase module 10 and is connected through the connection joint 25, thereafter any downstream modules will be a single phase module and connected through a single phase connection.

Embodiments of the present invention provide a series of connection joints including the connection joint 25 that interface with the 3-phase 4 bus group modular metering system 5 and connect two of 3-phase line and neutral turning into a single-phase 3 bus compatible to a single-phase group modular metering system. In one embodiment, there are 3 dedicated connection joints, including a 3-phase to AB single-phase (AB) connection joint, a 3-phase to AC single-phase (AC) connection joint and a 3-phase to BC single-phase (BC) connection joint. The above set forth AB, AC and BC single phases are for identification purposes only to identify to electrical engineers and technicians as to where the power comes from and to calculate and balance the load of each phase. It does not matter whether the power is configured as AB, AC and BC single phase to any single phase tenants. As all phases provide 120 volts to neutral and 208 volts between phases, the tenant loads on these voltages perform the same regardless of the phase configuration.

There are several advantages of these connection joints including the connection joint 25 such as easy to use and space saving. These connection joints including the connection joint 25 can directly fit between metering modules and provide electrical connection to specific phases. The AB and AC connection joints may be in a disc form. The AB and AC connection joints work as regular single bolt connection joints except that they contact to 3-phase A, B, C, and N phase bus on a 3-phase side of disc stacks. On the single-phase side, only connect to A, N, and B or A, N, and C by bridging to the single phase side as A, N, 'B' as single phase metering stacks always have main bus layout as A, N and B. The BC phase connection joint or spacer is constructed differently, as it needs to bridge C phase of a 3-phase bus to A phase of a single-phase bus while neutral and B phases are in between. The BC phase connection joint or spacer is a bussed enclosure spacer that interfaces with the 3-phase bus on one side and output a single-phase on the other side.

The 3 types, AB, AC, and BC, connection joints can be installed at any modular metering joints between enclosures. The AB and AC connection joints may be in such a disc form that takes no wall space, while the BC connection joint may have a 6" wide enclosure that gives convenience as a spacer when it is needed to set apart the meters to the nearest obstructer. To optimally balance the load of 3-phase power, any 2 of the 3 types connection joints can be selected in connection on both sides of mains between modular metering stacks.

As used herein, the "connection joint" refers to a 3-phase to single-phase connection joint such as a 3-phase to AB single-phase (AB) connection joint, a 3-phase to AC single-phase (AC) connection joint and a 3-phase to BC single-phase (BC) connection joint, as described herein, which corresponds to a single-phase connection interface designed to install in between a 3-phase system and a single-phase system. Its basic function is to distribute 3-phase four wire power from a 3-phase four main cross bus configuration to single-phase three wire power in a single-phase three main cross bus configuration. The "3-phase to single-phase connection joint," in addition to the exemplary hardware description above, refers to a device that is configured to derive single-phase 3 wire power from a 3-phase module to a single-phase in to single-phase out module while using modular meter stacks. It should be appreciated that several other components may be included in the "3-phase to single-phase connection joint." The "3-phase to single-phase connection joint," may be capable of operating based on its features such as bus configuration, construction type, and structural features.

The techniques described herein can be particularly useful for a "3-phase to single-phase connection joint." While particular embodiments are described in terms of a 3-phase bus or a single-phase bus, the techniques described herein are not limited to the 3-phase bus or the single-phase bus but can also use other multi-bus configurations with single-phase or multi-phase interfacing.

Figure 2:
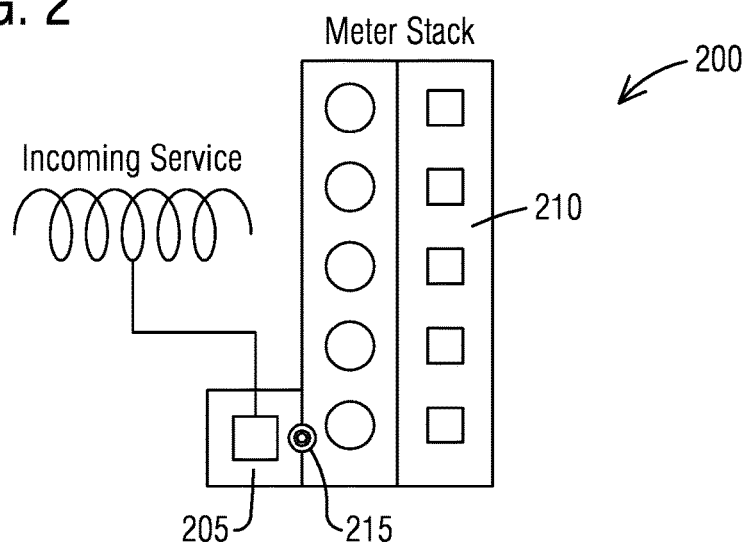
FIG. 2 illustrates a schematic view of a 3-phase group modular metering system including a 3-phase main connection module providing 3-phase 4 wire power from a 3-phase four main cross bus A, B, C and N configuration and a single-phase in to single-phase out modular meter stack for distributing single-phase 3 wire power from a single-phase three main cross bus A1, B1 and N1 configuration using a connection joint as a single-phase connection interface in accordance with an exemplary embodiment of the present invention.

Referring to FIG. 2, it illustrates a schematic view of a 3-phase group modular metering system 200 including a 3-phase main connection module 205 providing 3-phase 4 wire power from the 3-phase four main cross bus A, B, C and N configuration 30 and a single-phase in to single-phase out modular meter stack 210 for distributing single-phase 3 wire power from the single-phase three main cross bus A1, B1 and N1 configuration 35 using a connection joint 215 as the single-phase connection interface 27 in accordance with an exemplary embodiment of the present invention. The 3-phase main connection module 205 may be either a tap box or a main service disconnect. The 3-phase main connection module 205 accepts a 3-phase 4 wire or 3-phase busway to provide the 3-phase four main cross bus A, B, C and N configuration 30. A number of 3-phase metering module stacks may also be connected to the 3-phase main connection module 205 with 3-phase connections in the 3-phase four main cross bus A, B, C and N configuration 30.

Figure 3:
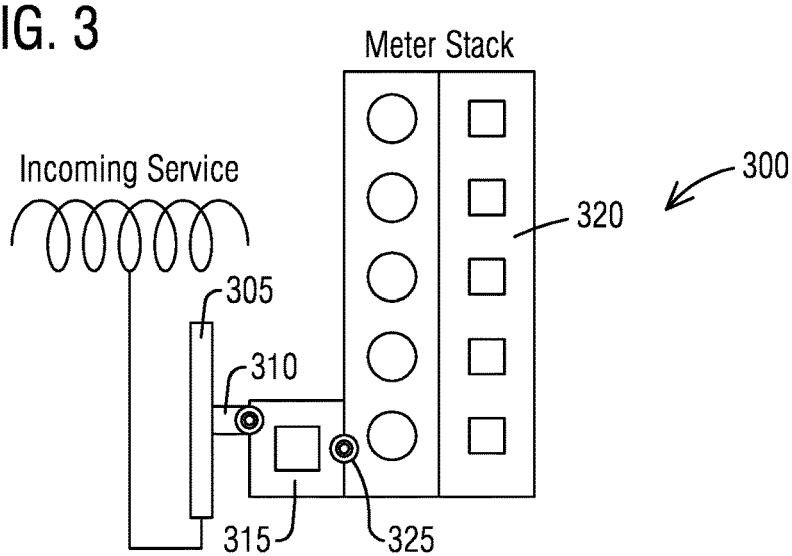
FIG. 3 illustrates a schematic view of a 3-phase group modular metering system including a busway with a tap stack connected to a 3-phase main connection module providing 3-phase 4 wire power from a 3-phase four main cross bus A, B, C and N configuration and a single-phase in to single-phase out modular meter stack for distributing single-phase 3 wire power from a single-phase three main cross bus A1, B1 and N1 configuration using a connection joint as a single-phase connection interface in accordance with an exemplary embodiment of the present invention.

Turning now to FIG. 3, it illustrates a schematic view of a 3-phase group modular metering system 300 including a busway 305 with a tap stack 310 connected to a 3-phase main connection module 315 providing 3-phase 4 wire power from a 3-phase four main cross bus A, B, C and N configuration. The 3-phase group modular metering system 300 includes a single-phase in to single-phase out modular meter stack 320 for distributing single-phase 3 wire power from a single-phase three main cross bus A1, B1 and N1 configuration. The 3-to-1-phase power is distributed by a connection joint 325 which functions as the single-phase connection interface 27 in accordance with an exemplary embodiment of the present invention.

Figure 4:
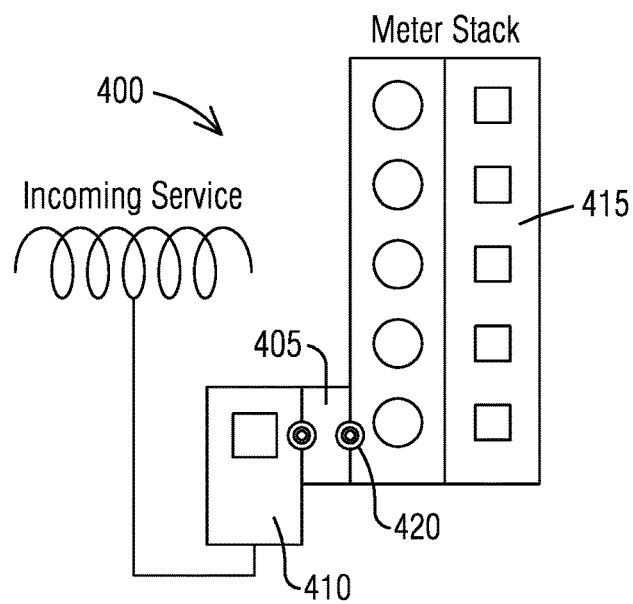
FIG. 4 illustrates a schematic view of a 3-phase group modular metering system including a spacer connected to a 3-phase main connection module providing 3-phase 4 wire power from a 3-phase four main cross bus A, B, C and N configuration and a single-phase in to single-phase out modular meter stack for distributing single-phase 3 wire power from a single-phase three main cross bus A1, B1 and N1 configuration using a connection joint as a single-phase connection interface in accordance with an exemplary embodiment of the present invention.

FIG. 4 illustrates a schematic view of a 3-phase group modular metering system 400 including a spacer 405 connected to a 3-phase main connection module 410 providing 3-phase 4 wire power from the 3-phase four main cross bus A, B, C and N configuration 30. The 3-phase group modular metering system 400 further includes a single-phase in to single-phase out modular meter stack 415 for distributing single-phase 3 wire power from the single-phase three main cross bus A1, B1 and N1 configuration 35. The 3-phase group modular metering system 400 further includes a connection joint 420 as the single-phase connection interface 27 in accordance with an exemplary embodiment of the present invention.

Figure 5:
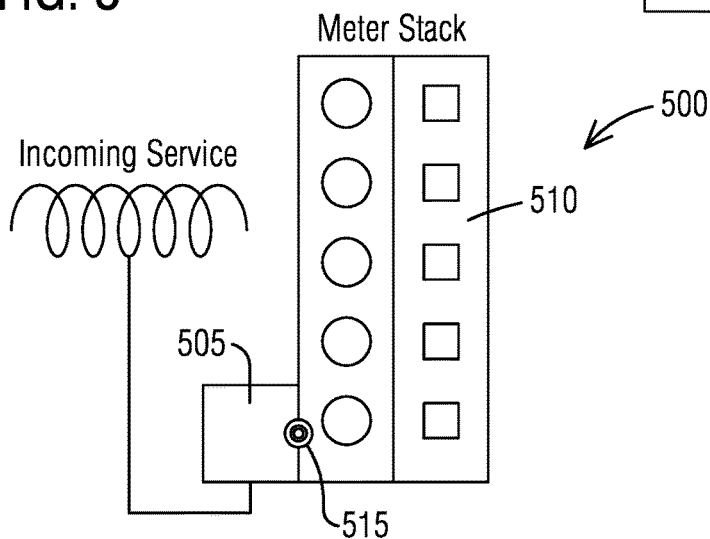
FIG. 5 illustrates a schematic view of a 3-phase group modular metering system including a tapbox providing 3-phase 4 wire power from a 3-phase four main cross bus A, B, C and N configuration and a single-phase in to single-phase out modular meter stack for distributing single-phase 3 wire power from a single-phase three main cross bus A1, B1 and N1 configuration using a connection joint as a single-phase connection interface in accordance with an exemplary embodiment of the present invention.

As shown in FIG. 5, it illustrates a schematic view of a 3-phase group modular metering system 500 including a tap-box 505 providing 3-phase 4 wire power from the 3-phase four main cross bus A, B, C and N configuration 30. The 3-phase group modular metering system 500 includes a single-phase in to single-phase out modular meter stack 510 for distributing single-phase 3 wire power from the single-phase three main cross bus A1, B1 and N1 configuration 35. The 3-phase group modular metering system 500 further includes a connection joint 515 as the single-phase connection interface 27 in accordance with an exemplary embodiment of the present invention.

Figure 6:
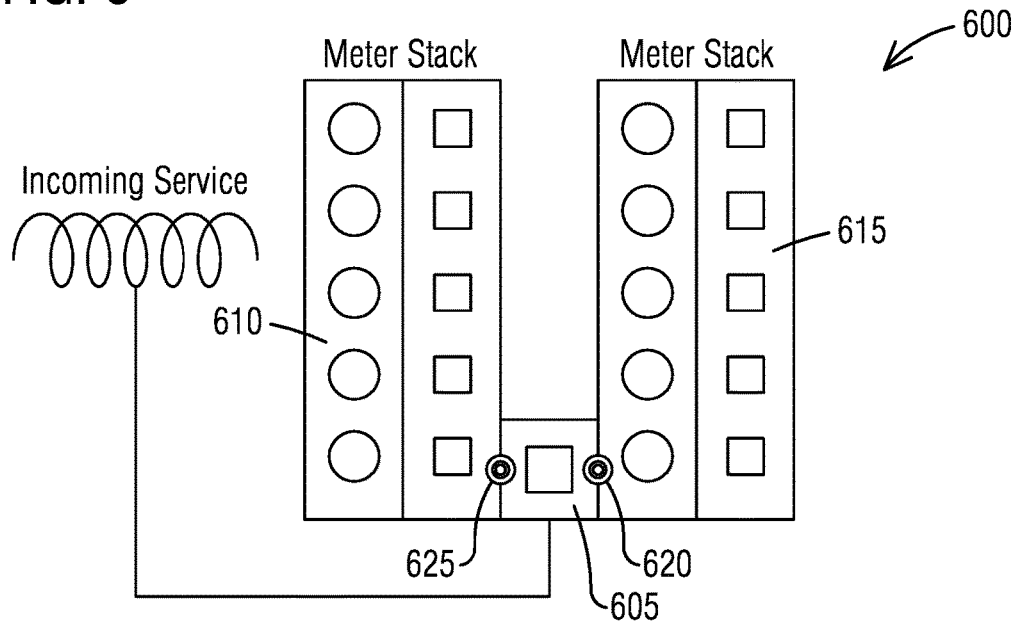
FIG. 6 illustrates a schematic view of a 3-phase group modular metering system in a center-fed configuration including a 3-phase main connection module coupled to a 3-phase in to single-phase out modular meter stack and a single-phase in to single-phase out modular meter stack for distributing single-phase 3 wire power derived from 3-phase 4 wire power using a connection joint as a single-phase connection interface in accordance with an exemplary embodiment of the present invention.

As seen in FIG. 6, it illustrates a schematic view of a 3-phase group modular metering system 600 in a center-fed configuration in accordance with an exemplary embodiment of the present invention. The 3-phase group modular metering system 600 includes a 3-phase main connection module 605 coupled to a 3-phase in to single-phase out modular meter stack 610 and a single-phase in to single-phase out modular meter stack 615. The 3-phase group modular metering system 600 includes a first connection joint 620 as the single-phase connection interface 27 for distributing single-phase 3 wire power derived from 3-phase 4 wire power. The 3-phase group modular metering system 600 further includes a second connection joint 625 as a 3-phase connection interface.

Figure 7:
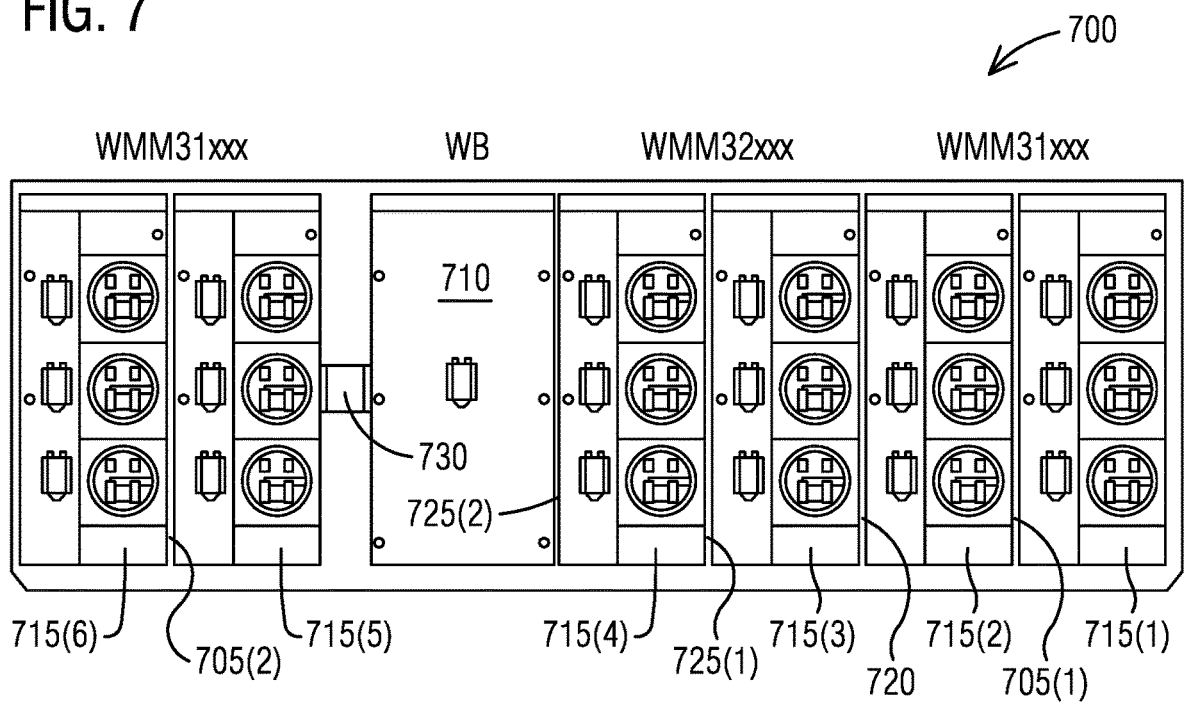
FIG. 7 illustrates a schematic view of a 3-phase group modular metering system showing a modular metering application using multiple different connection joints from 3-phase to single-phase for connecting one main disconnect WB and six modular meter stacks WMM in accordance with an exemplary embodiment of the present invention.

In FIG. 7, a schematic view of a 3-phase group modular metering system 700 is illustrated in accordance with an exemplary embodiment of the present invention. The 3-phase group modular metering system 700 shows a modular metering application that uses multiple different connection joints 705(1-6) from 3-phase to 3-phase or 3-phase to single-phase for connecting a main disconnect WB 710 and six modular meter stacks WMM 715(1-6).

In the 3-phase group modular metering system 700, a first single-phase connection joint (QC1) 705(1) is disposed between a first modular meter stack WMM31xxx 715(1) and a second modular meter stack WMM31xxx 715(2). A 3-phase-to-single-phase connection joint 720 such as an AB connection joint or an AC connection joint is disposed between the second modular meter stack WMM31xxx 715(2) and a third modular meter stack WMM32xxx 715(3). A first 3-phase connection joint (QC4) 725(1) is disposed between the third modular meter stack WMM32xxx 715(3) and a fourth modular meter stack WMM32xxx 715(4). A second 3-phase connection joint (QC4) 725(2) is disposed between the fourth modular meter stack WMM32xxx 715(4) and the main disconnect WB 710. A 3-phase-to-single-phase connection joint 730 such as a BC connection joint is disposed between the main disconnect WB 710 and a fifth modular meter stack WMM31xxx 715(5). A second single-phase connection joint (QC1) 705(2) is disposed between the fifth modular meter stack WMM31xxx 715(5) and a sixth modular meter stack WMM31xxx 715(6).

FIG. 7 illustrates a typical application of the connection joints from 3-phase to single-phase in 3-phase group modular metering system 700 that include the main disconnect WB 710 and the 6 modular meter stacks WMM 715(1-6) where the main disconnect WB 710 accepts 3-phase line power. The main disconnect WB 710 transmits the 3-phase line power through the main disconnect to a main cross bus. The main cross bus may be a set of bus bars laying cross side to side in modular metering devices for interconnecting to the main cross bus in other modules and to deliver electrical power from one enclosure to the next.

Between the enclosure of the main disconnect WB 710 and a meter stack, WMM32xxx, a 3-phase coupler connection QC4 such as the first 3-phase connection joint (QC4) 725(1) may be used. Another 3-phase coupler connection QC4 such as the second 3-phase connection joint (QC4)

725(2) between two meter stacks of WMM32xxx, may be used for connecting 3-phase main cross bus from the main disconnect WB 710 to and through WMM32xxx. Between the meter stack of WMM32xxx and the meter stack WMM31xxx, AB or AC type connection joints may be used to derive 3-phase power to single-phase power downstream by connecting to the 3-phase main cross bus in the meter stack of WMM32xxx and to single phase main cross bus in the meter stack of WMM31xxx. Between two single-phase meter stacks of WMM31xxx, there is a single-phase coupler connection QC1 such as the first single-phase connection joint (QC1) 705(1) that is used.

On the left side of the main disconnect WB 710, sometimes a spacer is needed to provide required clearance between a meter to the nearest obstruction, in this case the obstruction is WB because WB is deeper than the meter stacks. The additional depth of WB may cause obstruction to install meters or maintenance on meters if it is installed directly next to the meters. While the BC connection joint 730 is constructed with an enclosure, it can be installed as a spacer and as a connection joint from 3-phase to single-phase. Downstream from the main disconnect WB 710 through the BC connection joint 730, the main cross bus is single-phase, therefore, single phase meter stacks of WMM31xxx with single-phase coupler connections or single-phase connection joints QC1 705(1-2) in between them are installed.

Figure 8:
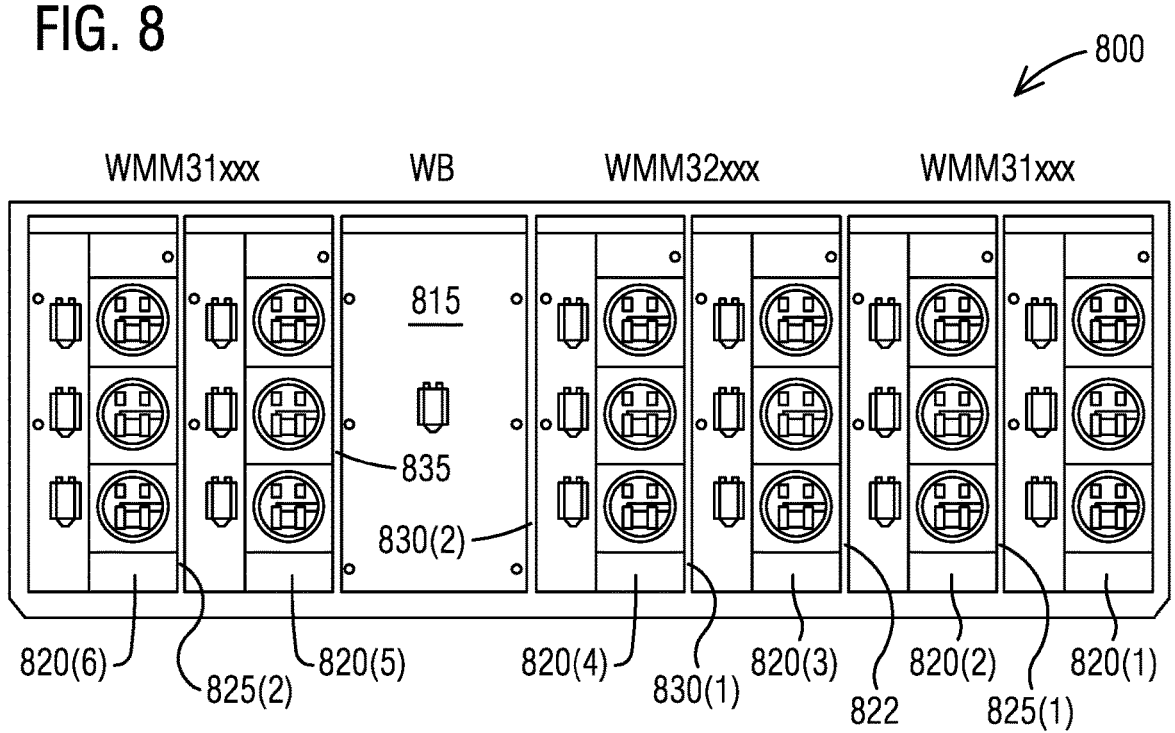
FIG. 8 illustrates a schematic view of a 3-phase group modular metering system showing a modular metering application using AB and AC connection joints on either side of a main disconnect WB for connecting six modular meter stacks WMM in accordance with an exemplary embodiment of the present invention.

With regard to FIG. 8, it illustrates a schematic view of a 3-phase group modular metering system 800 showing a modular metering application using an AB connection joint 805 and an AC connection joint 810 on either side of a main disconnect WB 815 for connecting six modular meter stacks WMM 820(1-6) in accordance with an exemplary embodiment of the present invention. A first single-phase connection joint (QC1) 825(1) is disposed between a first modular meter stack WMM31xxx 820(1) and a second modular meter stack WMM31xxx 820(2). A 3-phase-to-single-phase connection joint 822 such as an AB connection joint is disposed between the second modular meter stack WMM31xxx 820(2) and a third modular meter stack WMM32xxx 820(3). A first 3-phase connection joint (QC4) 830(1) is disposed between the third modular meter stack WMM32xxx 820(3) and a fourth modular meter stack WMM32xxx 820(4). A second 3-phase connection joint (QC4) 830(2) is disposed between the fourth modular meter stack WMM32xxx 820(4) and the main disconnect WB 815. A 3-phase-to-single-phase connection joint 835 such as an AC connection joint is disposed between the main disconnect WB 815 and a fifth modular meter stack WMM31xxx 820(5). A second single-phase connection joint (QC1) 825(2) is disposed between the fifth modular meter stack WMM31xxx 820(5) and a sixth modular meter stack WMM31xxx 820(6).

No spacers may be needed when certain main disconnects have the same depth as metering stacks or utilities do not need additional space for maintenance according to their utility metering device installation specifications. In this example, AB and AC connection joints 822, 835 can be used on either side of the main disconnect WB 815 as shown in FIG. 8.

Whenever the AB, AC connection joint 822, 835 or the BC connection joint 730 is used, the downstream main cross bus is loaded to AB, AC or BC respectively. For example, in FIG. 8, single-phase meter stacks 820(1-2) of WMM31xxx are on A and B phase, meanwhile single-phase meter stacks 820(5-6) of WMM31xxx are on A and C phase. Taking advantage of that the 3-phase meter stacks of WMM32xxx can be rephrased to any phase on each meter position. The 3-phase meter stacks 820(3-4) of WMM32xxx can be rephrased to B and C phase on all meter positions to balance the overall 3-phase load, or rephrase most meter positions to B and C phase according to the load calculation by leaving certain meter positions to be phased to AB or AC to fine tune a load balance.

Figure 9:
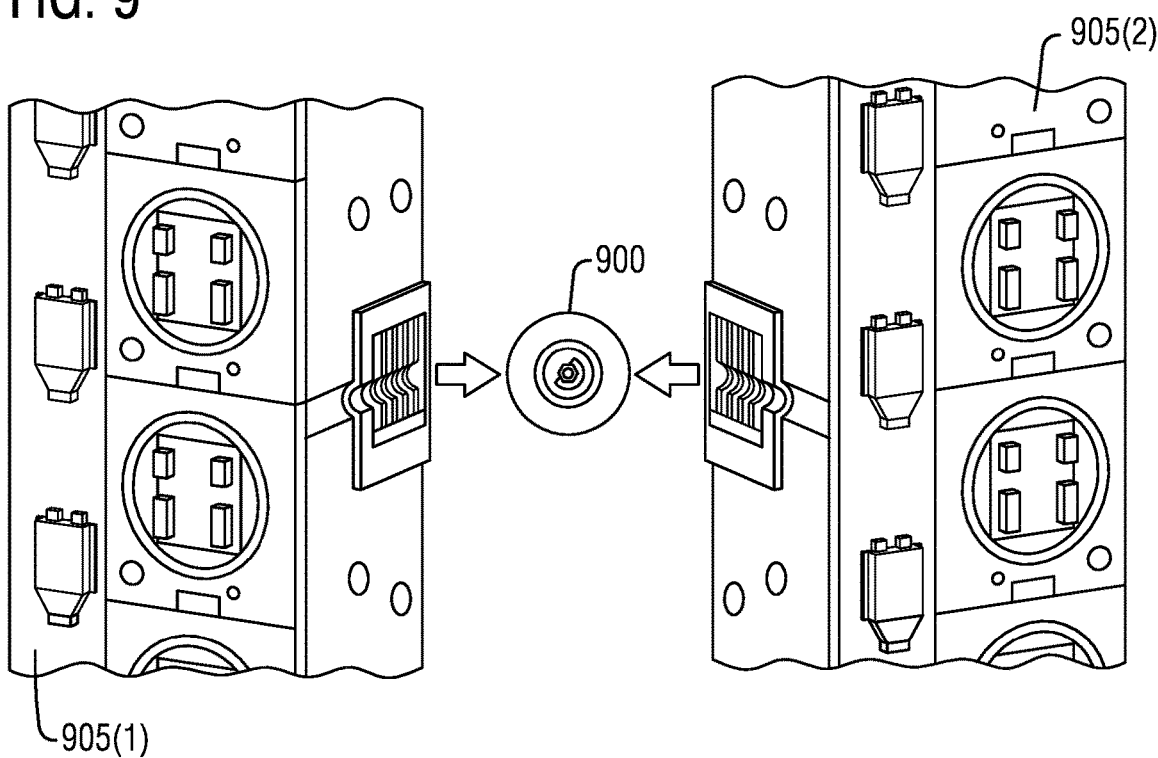
FIG. 9 illustrates a schematic view of a known 3-phase connection joint installed between two group metering modules.

With respect to FIG. 9, it illustrates a schematic view of a known 3-phase connection joint (QC4) 900 installed between two group metering modules 905(1-2). The known 3-phase connection joint (QC4) 900 comprises 4 aluminium plates housed in plastic discs. These discs are stacked together through a ⅜" bolt. Once the enclosures are jointed together with the known 3-phase connection joint (QC4) 900 in between interfacing with both main cross bus, an electrical connection is established by tightening a nut to 400 lb·ins. The single-phase connection joint (QC1) such as the second single-phase connection joint (QC1) 825(2) and the AB, AC connection joints 822, 835 are made in the same fashion as the known 3-phase connection joint (QC4) 900 for electrical connections except that they interface different phase of the main cross bus.

Figure 10:
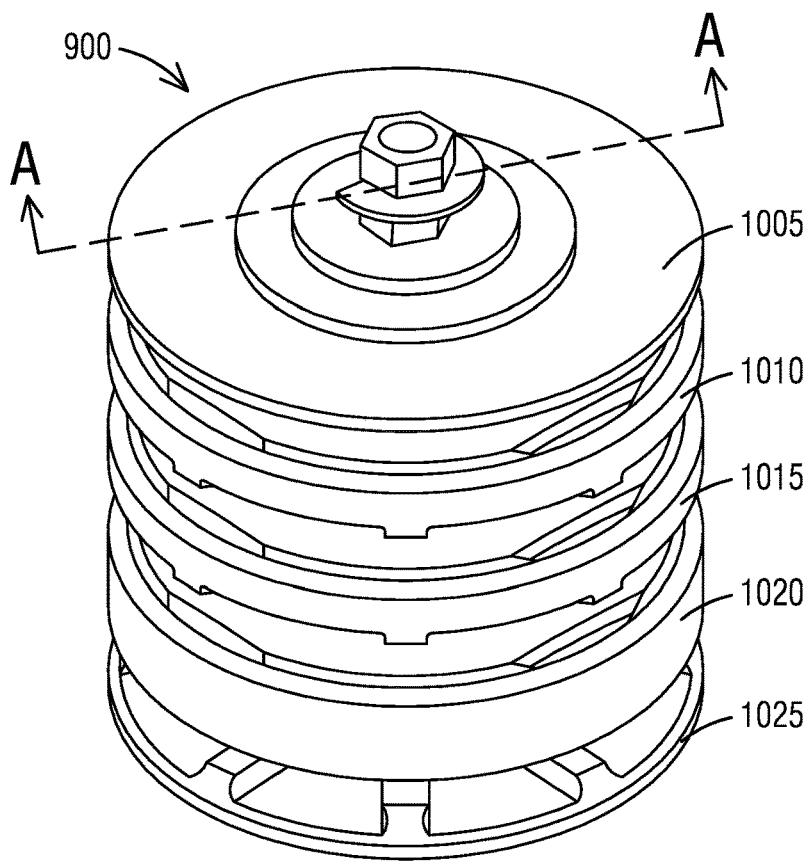
FIG. 10 illustrates an isometric view of the known 3-phase connection joint of FIG. 9.

Now referring to FIG. 10, it illustrates an isometric view of the known 3-phase connection joint (QC4) 900 of FIG. 9. The known 3-phase connection joint (QC4) 900 comprises an upper plastic disc 1005, two phase to neutral plastic discs 1010, 1015 housing an aluminium A phase connection plate and an N neutral connection plate in sequence, a phase to phase plastic disc 1020 housing two aluminium (B and C) connection plates on either side, and a bottom plastic disc 1025. All the plastic discs are stacked together and held together with a ⅜" carriage bolt and a nut with Belleville washer on top of a flat washer. A plastic tubing is sleeved over the carriage bolt as insulation. The known 3-phase connection joint (QC4) 900 accepts 4 bus arranged as A, N, B and C phase of typical 3 phase 4 wire system bussing for left and right sides.

Figure 11:
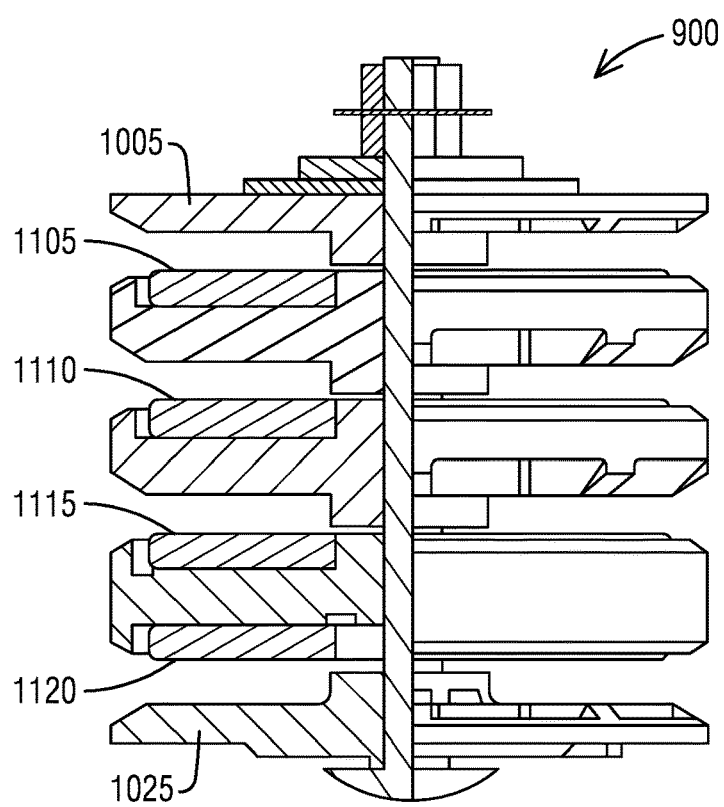
FIG. 11 illustrates a cross-sectional view of the known 3-phase connection joint of FIG. 10 at an axis A-A in FIG. 10.

In FIG. 11, it illustrates a cross-sectional view of the known 3-phase connection joint (QC4) 900 of FIG. 10 at an axis A-A in FIG. 10. The known 3-phase connection joint (QC4) 900 includes an A phase connection plate 1105, an N neutral connection plate 1110, a B phase connection plate 1115, and a C phase connection plate 1120.

Figure 12:
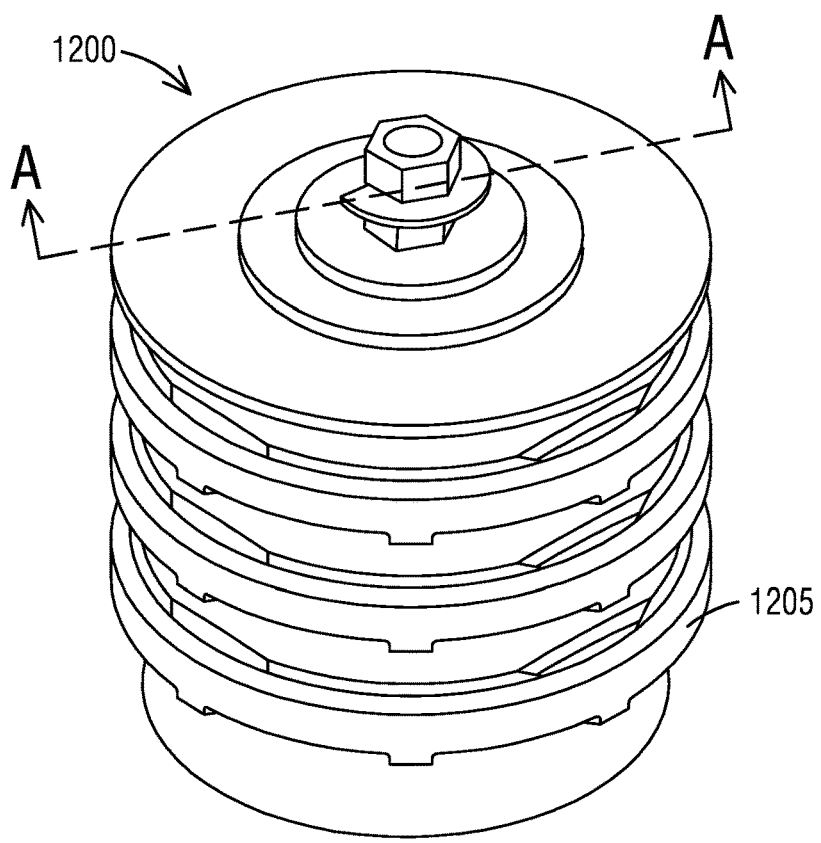
FIG. 12 illustrates an isometric view of a known 1-phase connection joint.

Referencing FIG. 12, it illustrates an isometric view of a known 1-phase connection joint (QC1) 1200. The known 1-phase connection joint (QC1) 1200 is constructed in similar fashion as the known 3-phase connection joint (QC4) 900, except that the phase to phase plastic disc and bottom disc and two aluminium (B and C phase) connection plates are replaced with a thick bottom plastic disc 1205 housing an aluminium (B phase) connection plate. The known 1-phase connection joint (QC1) 1200 accepts 3 bus arranged as A, N, and B phase of a typical single-phase 3 wire system bussing for left and right sides.

Figure 13:
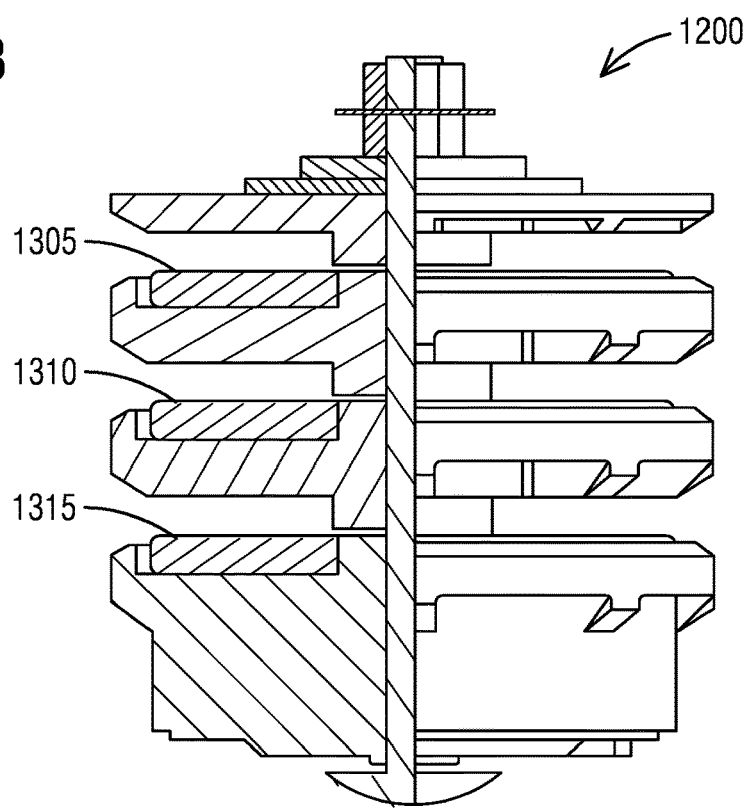
FIG. 13 illustrates a cross-sectional view of the known 1-phase connection joint of FIG. 12 at an axis A-A in FIG. 12.

As illustrated, FIG. 13 shows a cross-sectional view of the known 1-phase connection joint (QC1) 1200 of FIG. 12 at an axis A-A in FIG. 12. The 1-phase connection joint (QC1) 1200 includes an A phase connection plate 1305, an N neutral connection plate 1310, and a B phase connection plate 1315.

Figure 14:
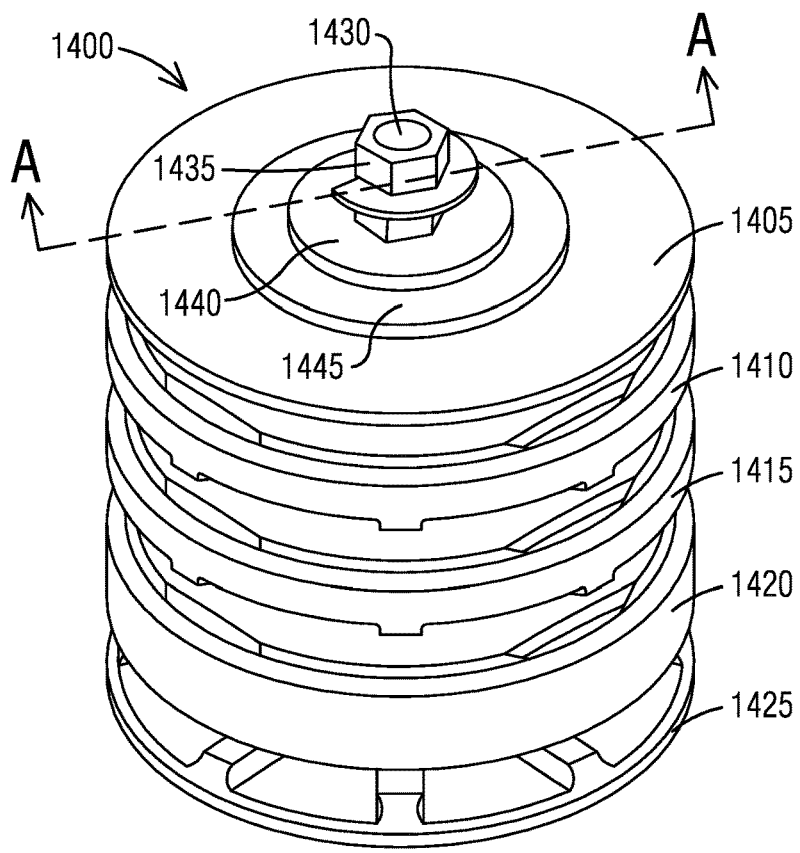
FIG. 14 illustrates an isometric view of a 3-to-1-phase AB connection joint in accordance with an exemplary embodiment of the present invention.

Turning to FIG. 14, it illustrates an isometric view of a 3-to-1-phase AB connection joint 1400 in accordance with an exemplary embodiment of the present invention. The 3-to-1-phase AB connection joint 1400 is in a disc form and connects to A, B and N of the 3-phase four main cross bus A, B, C and N configuration 30 into the single-phase three main cross bus of A1, B1 and N1 configuration 35. The 3-to-1-phase AB connection joint 1400 comprises multiple aluminium plates housed in plastic discs. These discs are stacked together through a bolt. Once the enclosures are jointed together with the 3-to-1-phase AB connection joint 1400 in between interfacing with both main cross bus, an electrical connection is established by tightening a nut to 400 lb·ins.

The 3-to-1-phase AB connection joint 1400 comprises an upper plastic disc 1405, two phase to neutral plastic discs 1410, 1415 housing an aluminium A phase connection plate and an N neutral connection plate in sequence, a phase to phase plastic disc 1420 housing two aluminium (B and C phase) connection plates on either side, and a bottom plastic disc 1425. All the plastic discs 1405, 1410, 1415, 1420, and 1425 are stacked together and held together with a ⅜" carriage bolt 1430 and a nut 1435 with a Belleville washer 1440 on top of a flat washer 1445. A plastic tubing is sleeved over the carriage bolt 1430 as insulation.

In the 3-to-1-phase AB connection joint 1400, the C phase connection plate is coupled to a spacer plate on the single-phase side. For example, the C phase connection plate may be welded to the spacer plate. See FIG. 18. The spacer plate on the single-phase side serves exactly as a spacer while the 3-phase side of the 3-to-1-phase AB connection joint 1400 accepts 4 bus of a 3-phase system, meanwhile the single-phase side of the 3-to-1-phase AB connection joint 1400 accepts 3 bus of a single-phase system. In the 3-to-1-phase AB connection joint 1400, the C phase bus of the 3-phase system is terminated on the single-phase side by the spacer plate, while the A, N and B phase bus are connected through.

Figure 15:
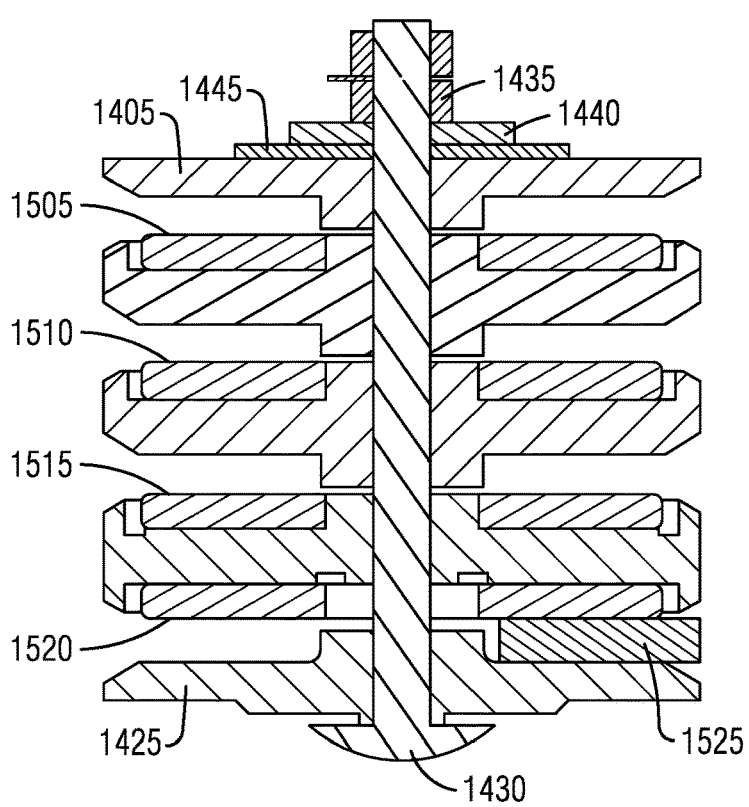
FIG. 15 illustrates a cross-sectional view of the 3-to-1-phase AB connection joint of FIG. 14 at an axis A-A in FIG. 14 in accordance with an exemplary embodiment of the present invention.

Regarding FIG. 15, it illustrates a cross-sectional view of the 3-to-1-phase AB connection joint 1400 of FIG. 14 at an axis A-A in FIG. 14 in accordance with an exemplary embodiment of the present invention. The 3-to-1-phase AB connection joint 1400 includes an A phase connection plate 1505, an N neutral connection plate 1510, a B phase connection plate 1515, and a C phase connection plate 1520. Underneath the C phase connection plate 1520 on the single-phase side of the interface a C phase spacer plate 1525 is disposed to block a connection to main cross bus C of the 3-phase four main cross bus A, B, C and N configuration 30.

Figure 16:
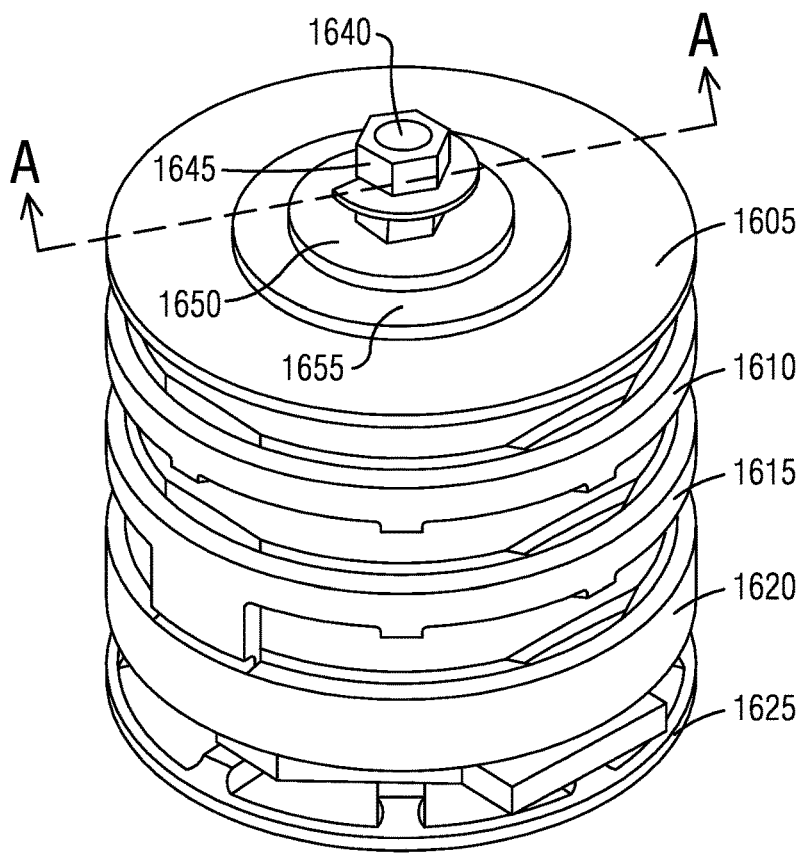
FIG. 16 illustrates an isometric view of a 3-to-1-phase AC connection joint in accordance with an exemplary embodiment of the present invention.

In regard to FIG. 16, it illustrates an isometric view of a 3-to-1-phase AC connection joint 1600 in accordance with an exemplary embodiment of the present invention. The 3-to-1-phase AC connection joint 1600 is in a disc form and connects to A, C and N of the 3-phase four main cross bus A, B, C and N configuration 30 into the single-phase three main cross bus of A1, B1 and N1 configuration 35. The 3-to-1-phase AC connection joint 1600 comprises multiple aluminium plates housed in plastic discs. These discs are stacked together through a bolt. Once the enclosures are jointed together with the 3-to-1-phase AC connection joint 1600 in between interfacing with both main cross bus, an electrical connection is established by tightening a nut to 400 lb·ins.

The 3-to-1-phase AC connection joint 1600 comprises an upper plastic disc 1605, two phase to neutral plastic discs 1610, 1615 housing an aluminium A phase connection plate and an N neutral connection plate in sequence. The 3-to-1-phase AC connection joint 1600 further comprises a phase to phase B and C plastic disc 1620 housing an aluminium (C phase) connection plate on bottom side and a bottom plastic disc 1625. All the plastic discs 1605, 1610, 1615, 1620, and 1625 are stacked together and held together with a ⅜" carriage bolt 1640 and a nut 1645 with a Belleville washer 1650 on top of a flat washer 1655. A plastic tubing is sleeved over the carriage bolt 1640 as insulation.

Figure 17:
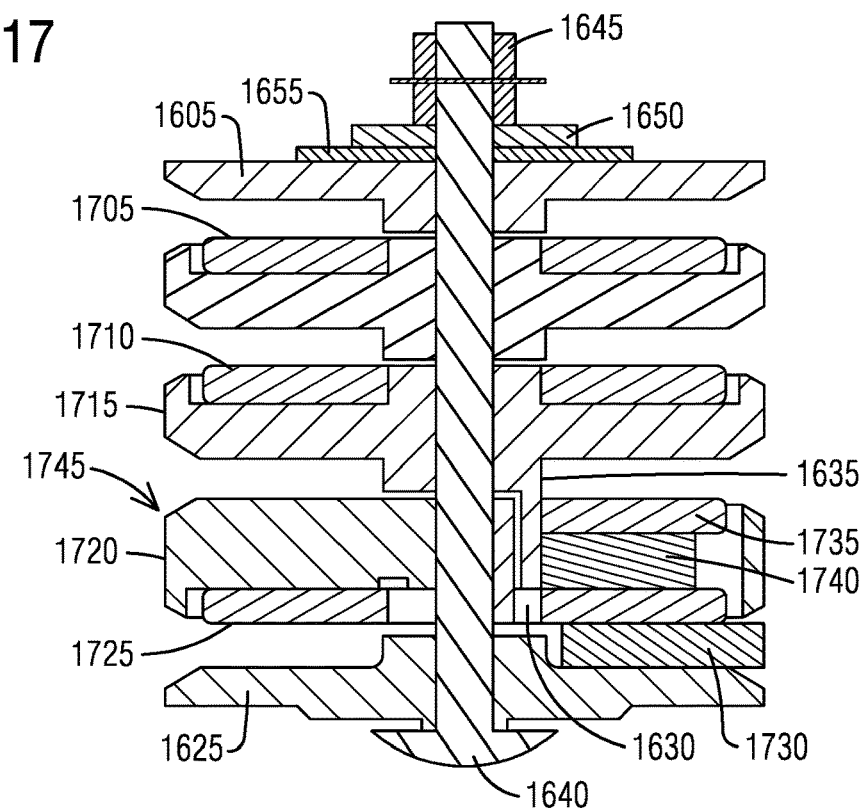
FIG. 17 illustrates a cross-sectional view of the 3-to-1-phase AC connection joint of FIG. 16 at an axis A-A in FIG. 16 in accordance with an exemplary embodiment of the present invention.

As shown, FIG. 17 illustrates a cross-sectional view of the 3-to-1-phase AC connection joint 1600 of FIG. 16 at an axis A-A in FIG. 16 in accordance with an exemplary embodiment of the present invention. The 3-to-1-phase AC connection joint 1600 includes an A phase connection plate 1705, an N neutral connection plate 1710, a Neutral housing 1715, a B and C phase housing 1720, and a C phase connection plate 1725. Opposite of the B and C phase housing 1720 on the single-phase side of the interface a C phase spacer plate 1730 is disposed to block a connection to main cross bus C of the 3-phase four main cross bus A, B, C and N configuration 30. Opposite of the B and C phase housing 1720 on the single-phase side of the interface, a B phase connection plate 1735 is disposed. Opposite of the B and C phase housing 1720 on the single-phase side of the interface, a jumper spacer 1740 is disposed between the B phase connection plate 1735 and the C phase connection plate 1725.

The 3-to-1-phase AC connection joint 1600 includes the C phase connection plate 1725 on the 3-phase side and the single-phase side. On the single-phase side of the C phase connection plate 1725 the jumper spacer 1740 and the C phase spacer plate 1730 is coupled on either side of the C phase connection plate 1725 on the single-phase side. The jumper spacer 1740 and the C phase spacer plate 1730 are attached to the C phase connection plate 1725 to bridge the electrical connection from C phase of a 3-phase system to B phase of a single-phase system. Therefore, the single-phase side of the 3-to-1-phase AC connection joint 1600 accepts 3 bus of the single phase system (A, N and C).

The 3-to-1-phase AC connection joint 1600 includes the B phase connection plate 1735 only on the single-phase side. The jumper spacer 1740 is sandwiched between the C phase connection plate 1725 and the B phase connection plate 1735. The 3-phase side of the 3-to-1-phase AC connection joint 1600 accepts 4 bus of a 3-phase system, but the 3-phase side B phase of the 3-to-1-phase AC connection joint 1600 does not conduct as the phase to phase B and C plastic disc 1620 has an extra thickness to adapt the 3-phase bus.

The phase to phase B and C plastic disc 1620 does not have a B phase connection plate instead has an extra thickness 1745 of the plastic to fill the space emptied by removal of the B phase connection plate in order to adapt the 3-phase bus. The phase to phase B and C plastic disc 1620 has a gap 1630 on the single-phase side. The neutral plastic disc 1610 has an extended tab 1635 on the single-phase side that extends into the gap 1630 to provide an extended barrier that isolates the 3-phase bus of the 3-phase side from the single-phase side B phase connection plate.

Figure 18:
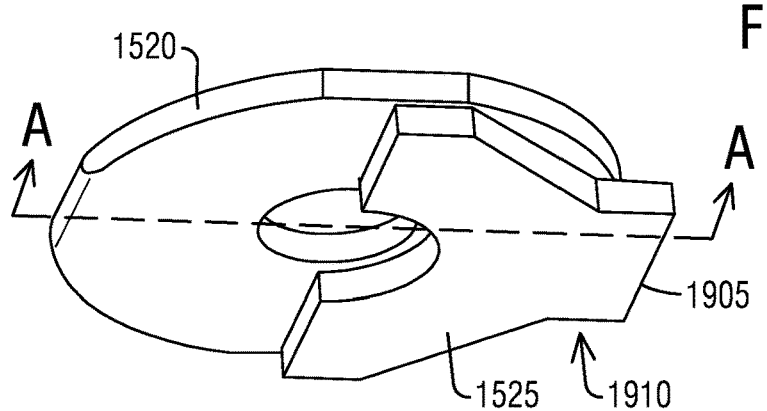
FIG. 18 illustrates an isometric view of a C phase connection plate in the 3-to-1-phase AB connection joint of FIG. 14 in accordance with an exemplary embodiment of the present invention.
Figure 19:
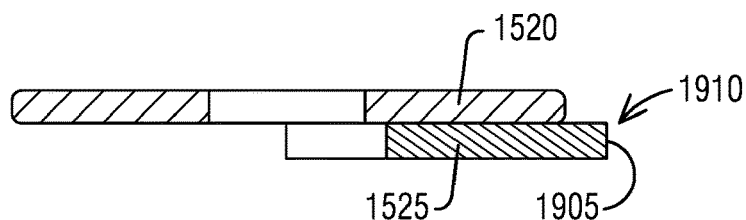
FIG. 19 illustrates a cross-sectional view of the C phase connection plate in the 3-to-1-phase AB connection joint of FIG. 14 at an axis A-A in FIG. 18 in accordance with an exemplary embodiment of the present invention.

As seen, FIG. 18 illustrates an isometric view of the C phase connection plate 1520 in the 3-to-1-phase AB connection joint 1400 of FIG. 14 in accordance with an exemplary embodiment of the present invention. FIG. 19 illustrates a cross-sectional view of the C phase connection plate 1520 in the 3-to-1-phase AB connection joint 1400 of FIG. 14 at an axis A-A in FIG. 18 in accordance with an exemplary embodiment of the present invention. Underneath the C phase connection plate 1520 on the single-phase side of the interface the C phase spacer plate 1525 is disposed. The C phase spacer plate 1525 extends beyond a distal end 1905 of the C phase connection plate 1520 and defines a tab 1910 protruding from the distal end 1905 of the C phase connection plate 1520. The tab 1910 on the outer side of the C phase spacer plate 1525 is to indicate the side of interface with a single-phase bus.

In one embodiment, the C phase spacer plate 1525 has a same thickness as the phase bus and is either welded on or fastened to the C phase connection plate 1520. The C phase spacer plate 1525 has a bigger cut-off arc inside to clear a positioning cylinder feature on the bottom plastic disc 1625. The outer side of the C phase spacer plate 1525 has cut-offs on sides for electrical clearance.

Figure 20:
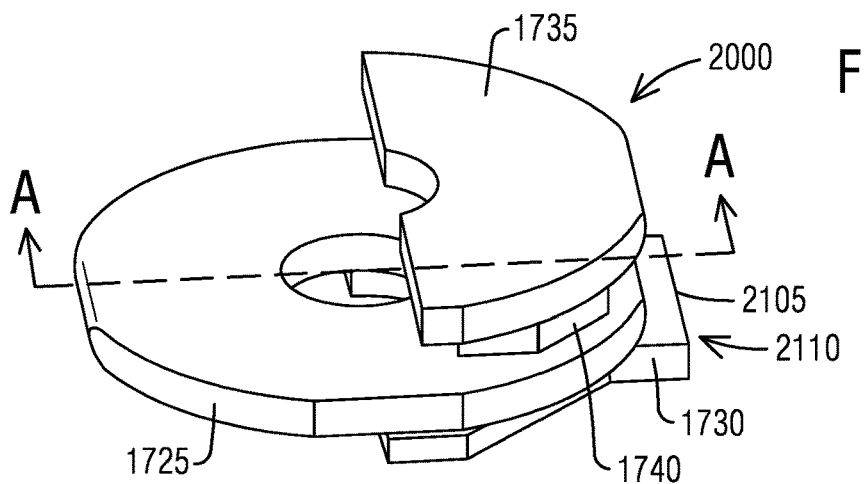
FIG. 20 illustrates an isometric view of a jumper connection from C phase of a 3-phase system to B phase of a single-phase system in accordance with an exemplary embodiment of the present invention.
Figure 21:
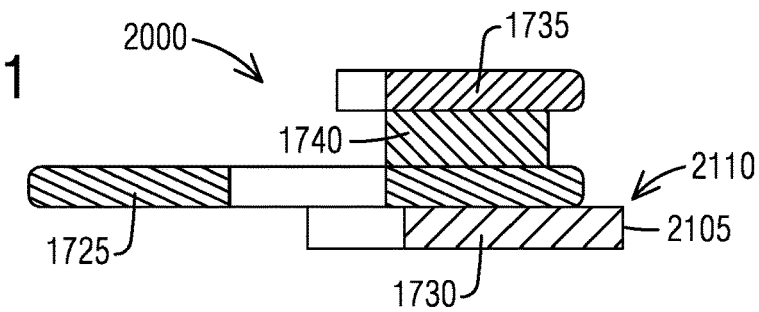
FIG. 21 illustrates a cross-sectional view of the jumper connection from C phase of a 3-phase system to B phase of a single-phase system at an axis A-A in FIG. 20 in accordance with an exemplary embodiment of the present invention.

In FIG. 20, it illustrates an isometric view of a jumper spacer connection 2000 from C phase of a 3-phase system to B phase of a single-phase system in the 3-to-1-phase AC connection joint 1600 of FIG. 16 in accordance with an exemplary embodiment of the present invention. FIG. 21 illustrates a cross-sectional view of the jumper spacer connection 2000 from C phase of a 3-phase system to B phase of a single-phase system at an axis A-A in FIG. 20 in accordance with an exemplary embodiment of the present invention.

The jumper spacer connection 2000 comprises the jumper spacer 1740, the C phase spacer plate 1730 and the B phase connection plate 1735. On the single-phase side of the interface, the B phase connection plate 1735, the jumper spacer 1740 and the C phase spacer plate 1730 are disposed. The C phase spacer plate 1730 extends beyond a distal end 2105 of the C phase connection plate 1725 and defines a tab 2110 protruding from the distal end 2105 of the C phase connection plate 1725. The tab 2110 on the outer side of the C phase spacer plate 1730 is to indicate the side of interface with a single-phase bus.

The jumper spacer connection 2000 is electrically connected to the B phase connection plate 1735, which is less than a half of a regular phase connection plate. All the components of the jumper spacer connection 2000 including the jumper spacer 1740, the C phase spacer plate 1730 and the B phase connection plate 1735 are fastened or welded together. The jumper spacer connection 2000 works with a first plastic disc (shown in FIG. 22) between neutral N and B phase and a second plastic disc between B and C phase (shown in FIG. 23), which provide barrier and housing, isolates B phase bus of the 3-phase system and connects C phase bus of the 3-phase system to B phase bus in the single-phase system.

Figure 22:
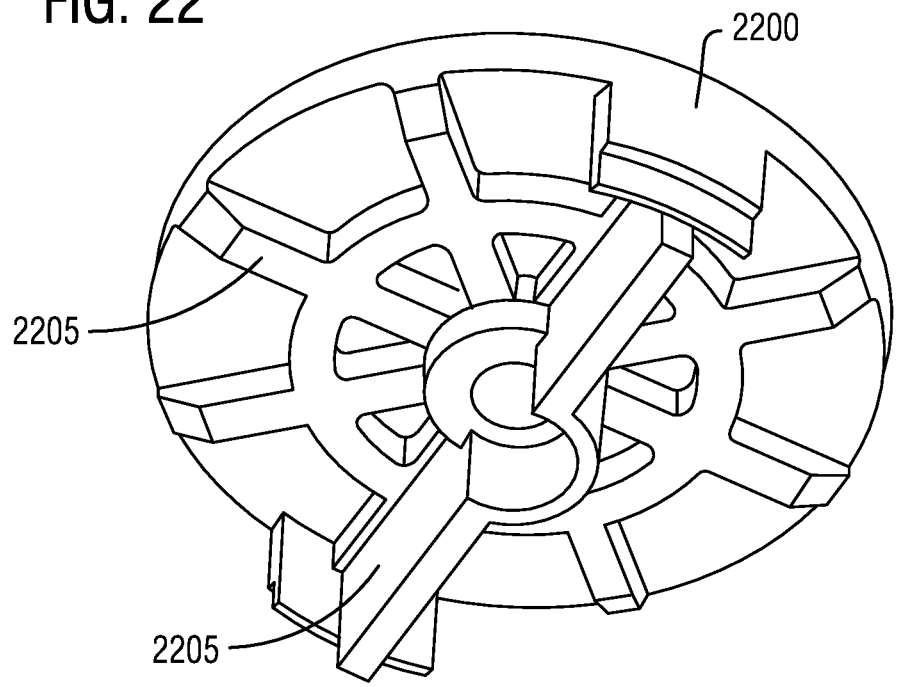
FIG. 22 illustrates an isometric view of a plastic disc between neutral N and phase B of the 3-to-1-phase AC connection joint of FIG. 16 in accordance with an exemplary embodiment of the present invention.

Next, FIG. 22 illustrates an isometric view of a first plastic disc 2200 between neutral N and phase B of the 3-to-1-phase AC connection joint 1600 of FIG. 16 in accordance with an exemplary embodiment of the present invention. The first plastic disc 2200 includes protruded features 2205 as barriers for isolating and insulating the 3-phase side bus from the single-phase side bus.

Figure 23:
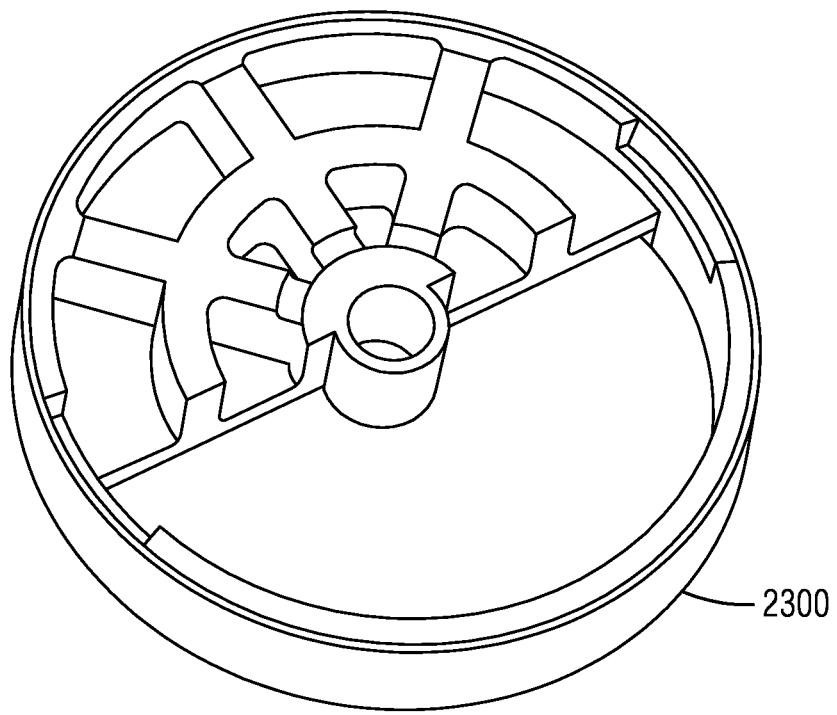
FIG. 23 illustrates an isometric view of a plastic disc between phase B and phase C of the 3-to-1-phase AC connection joint of FIG. 16 in accordance with an exemplary embodiment of the present invention.

FIG. 23 illustrates an isometric view of a second plastic disc 2300 between phase B and phase C of the 3-to-1-phase AC connection joint 1600 of FIG. 16 in accordance with an exemplary embodiment of the present invention. The single-phase side of the second plastic disc 2300 is cut off to provide a connection path from the C phase connection plate 1725 to the B phase connection plate 1735. The 3-phase side of the second plastic disc 2300 adds an additional thickness to compensate for the absent half of the B phase connection plate 1735.

Figure 24:
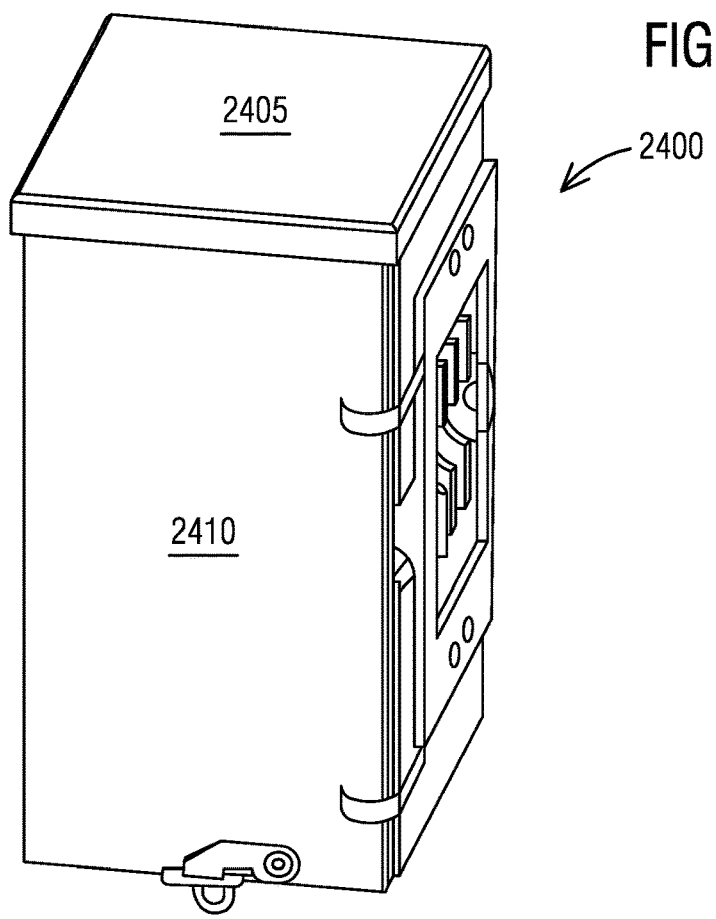
FIG. 24 illustrates an isometric view of a 3-to-1-phase BC connection joint in accordance with an exemplary embodiment of the present invention.

Referring next to FIG. 24, which illustrates an isometric view of a 3-to-1-phase BC connection joint or spacer 2400 in accordance with an exemplary embodiment of the present invention. The 3-to-1-phase BC connection joint or spacer 2400 is in a bussed enclosure form and connects to B, C and N of the 3-phase four main cross bus A, B, C and N configuration 30 into the single-phase three main cross bus of A1, B1 and N1 configuration 35. The 3-to-1-phase BC connection joint or spacer 2400 includes a metal enclosure 2405 having a cover 2410 and opening on both sides. In one embodiment, the metal enclosure 2405 is about 12" high, 6" wide and 7" deep.

Figure 25:
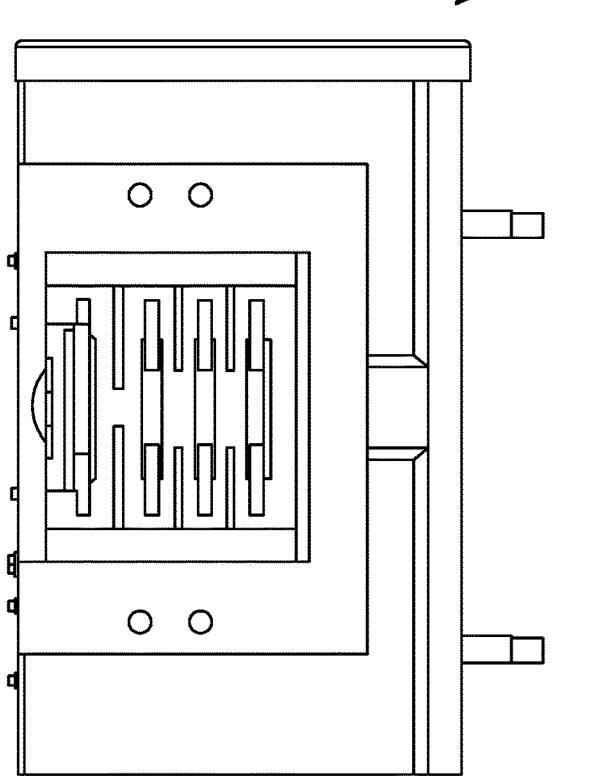
FIG. 25 illustrates a left view of the 3-to-1-phase BC connection joint shown in FIG. 24 in accordance with an exemplary embodiment of the present invention.

FIG. 25 illustrates a left view of the 3-to-1-phase BC connection joint or spacer 2400 shown in FIG. 24 in accordance with an exemplary embodiment of the present invention. The left view shows an interface with a 3 bus single-phase system. It is also shown in the left view that a C phase bus is absent at the left side. Therefore, the right side of the metal enclosure 2405 can interface with a QC4 connection joint to make a 3-phase connection, and the left side of the metal enclosure 2405 can interface with a QC1 connection joint to make a single-phase connection.

Figure 26:
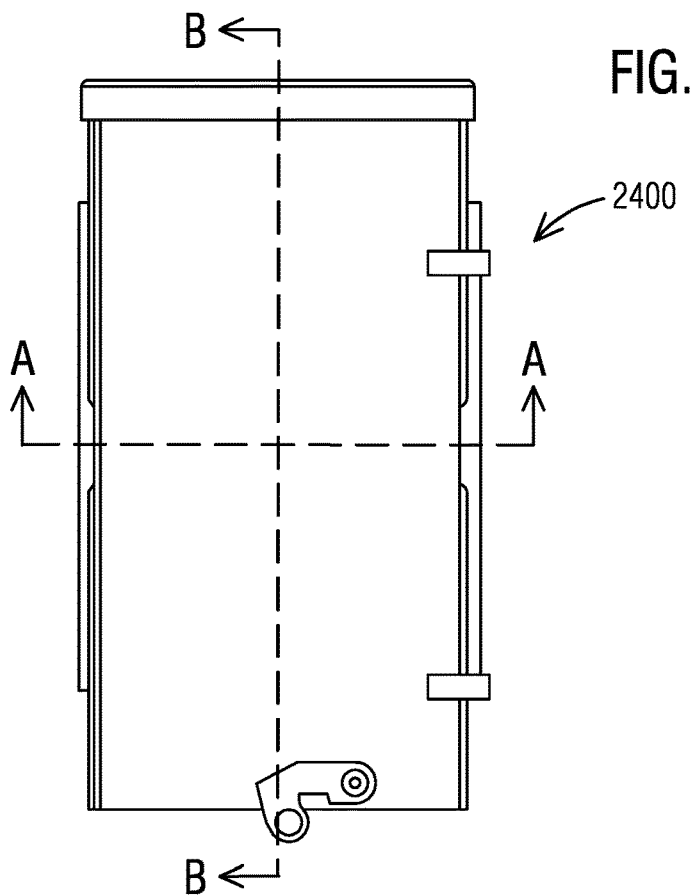
FIG. 26 illustrates a front view of the 3-to-1-phase BC connection joint shown in FIG. 24 in accordance with an exemplary embodiment of the present invention.
Figure 27:
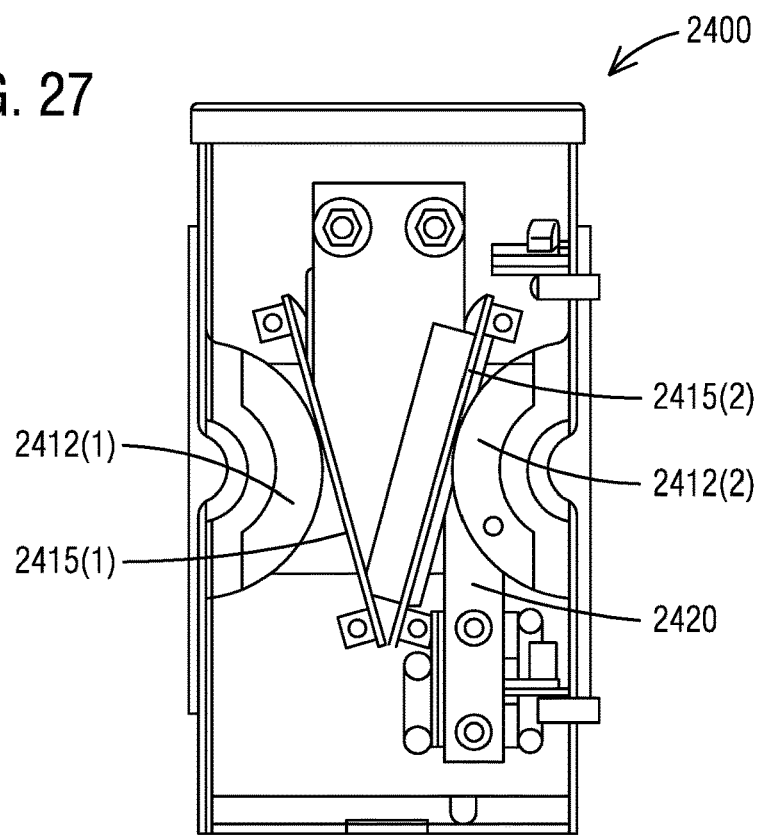
FIG. 27 illustrates a front view without a cover of the 3-to-1-phase BC connection joint shown in FIG. 24 in accordance with an exemplary embodiment of the present invention.

FIG. 26 illustrates a front view of the 3-to-1-phase BC connection joint or spacer 2400 shown in FIG. 24 in accordance with an exemplary embodiment of the present invention. FIG. 27 illustrates a front view without the cover 2410 of the 3-to-1-phase BC connection joint or spacer 2400 shown in FIG. 24 in accordance with an exemplary embodiment of the present invention.

In the front view without the cover 2410, there are two half circle shaped insulators 2412(1-2), two plastic insulators 2415(1-2) individually fastened to back wall like "V", and one rectangle insulator 2420 wrapping the end of left A phase bus which are providing support and spacing for the phase bus. The 3-to-1-phase BC connection joint or spacer 2400 may be made up and down invertible so that it can be installed on left or right side of a 3-phase system to through a single-phase system.

Figure 28:
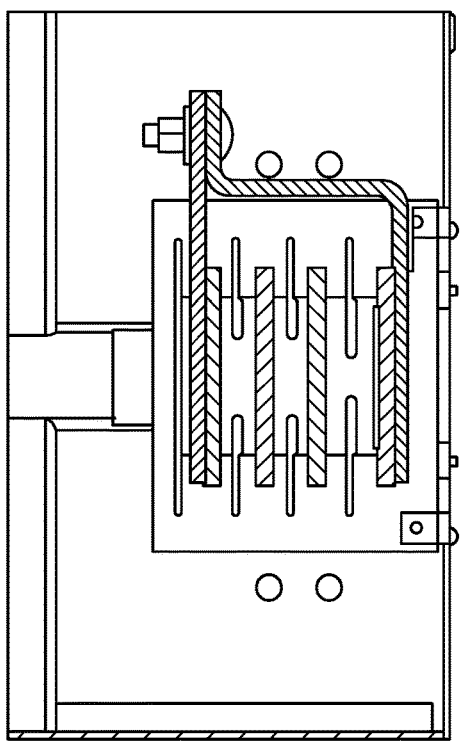
FIG. 28 illustrates a cross-sectional view of the 3-to-1-phase BC connection joint shown in FIG. 26 at an axis B-B in accordance with an exemplary embodiment of the present invention.

FIG. 28 illustrates a cross-sectional view of the 3-to-1-phase BC connection joint or spacer 2400 shown in FIG. 26 at an axis B-B in accordance with an exemplary embodiment of the present invention. It is shown that a C phase jumper bus and an A phase tap bus are fastened together with bolts and nuts. In such a way, a C phase bus connecting from the left is electrically connected to an A phase bus to the right.

Figure 29:
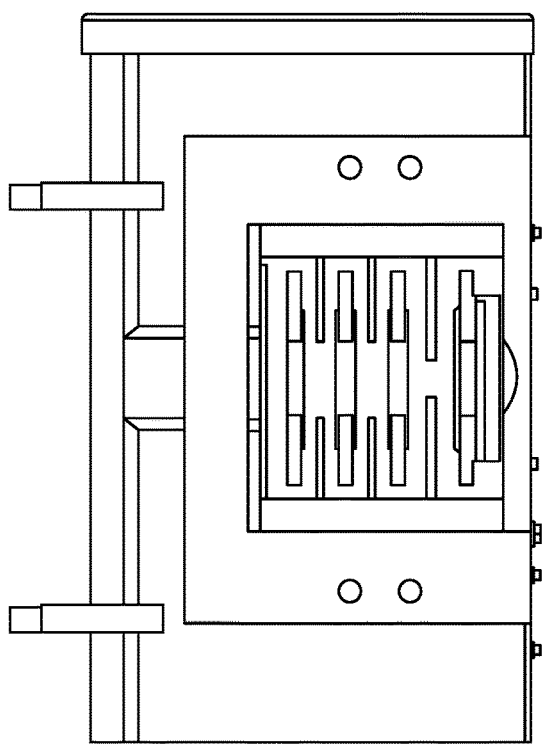
FIG. 29 illustrates a right view of the 3-to-1-phase BC connection joint shown in FIG. 24 in accordance with an exemplary embodiment of the present invention.

FIG. 29 illustrates a right view of the 3-to-1-phase BC connection joint or spacer 2400 shown in FIG. 24 in accordance with an exemplary embodiment of the present invention. The right view shows an interface with a 4 bus 3-phase system.

Figure 30:
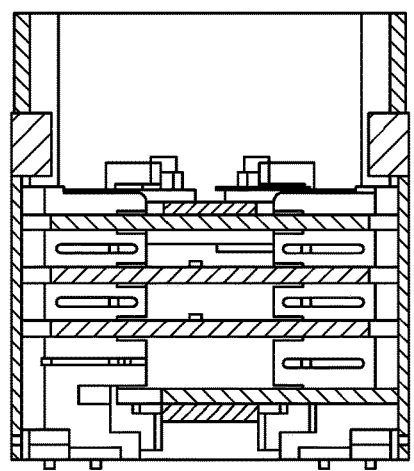
FIG. 30 illustrates a cross-sectional view of the 3-to-1-phase BC connection joint shown in FIG. 26 at an axis A-A in accordance with an exemplary embodiment of the present invention.

FIG. 30 illustrates a cross-sectional view of the 3-to-1-phase BC connection joint or spacer 2400 shown in FIG. 26 at an axis A-A in accordance with an exemplary embodiment of the present invention. It can be seen that an A phase bus is in two pieces. The left side piece, about ⅔ of the overall width of the metal enclosure 2405, has another bus fastened or welded on, while the right side piece, about ⅓ of the overall width of the metal enclosure 2405, is terminated in the metal enclosure 2405 being supported by a bracket and standoffs (see front view without cover). A neutral N bus and a B phase bus are one piece buses laid through from right to left that connect neutral and B phase bus from a 3-phase system on the right directly to neutral N and the B phase bus of a single-phase system on the left. A C phase bus is a short piece, ended at about ⅓ width to the left side. On bottom of the C phase bus, there is a jumper bus fastened or welded to the C phase bus.

Figure 31:
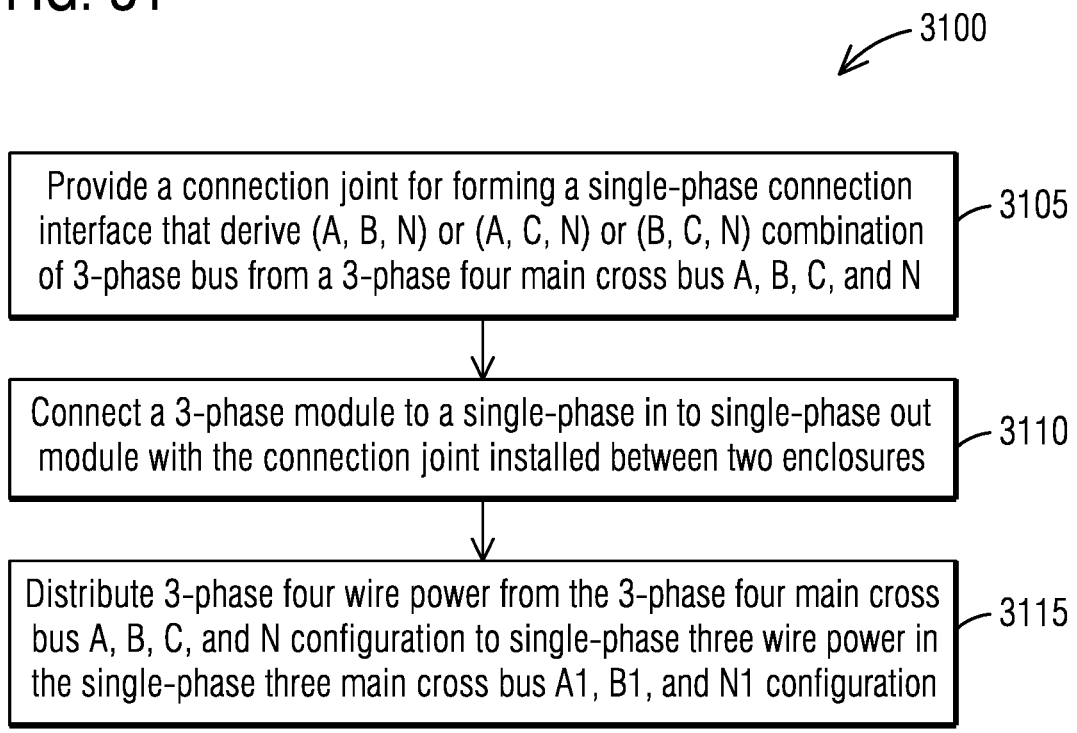
FIG. 31 illustrates a flow chart of a method of distributing 3-phase four wire power from a 3-phase four main cross bus A, B, C and N configuration to single-phase three wire power in a single-phase three main cross bus A1, B1 and N1 configuration by deriving (A, B, N) or (A, C, N) or (B, C, N) combination of 3-phase bus and forming single-phase connection interfaces according to an embodiment of the present invention.

FIG. 31 illustrates a flow chart of a method 3100 of distributing 3-phase four wire power into single-phase three wire power in accordance with an exemplary embodiment of the present invention. Reference is made to the elements and features described in FIGS. 1-30. It should be appreciated that some steps are not required to be performed in any particular order, and that some steps are optional.

The method 3100 in step 3105 includes providing the connection joint 25 for forming the single-phase connection interfaces 27 that derive (A, B, N) or (A, C, N) or (B, C, N) combination of 3-phase bus from a 3-phase four main cross bus A, B, C and N. The method 3100 in step 3110 further includes connecting the 3-phase module 10 to the single-phase in to single-phase out module 20 with the connection joint 25 installed between two enclosures. The method 3100 in step 3115 further includes distributing 3-phase four wire power from the 3-phase four main cross bus A, B, C and N configuration 30 to single-phase three wire power in the single-phase three main cross bus A1, B1 and N1 configuration 35.

While embodiments of the present invention have been disclosed in exemplary forms, it will be apparent to those skilled in the art that many modifications, additions, and deletions can be made therein without departing from the spirit and scope of the invention and its equivalents, as set forth in the following claims.

Embodiments and the various features and advantageous details thereof are explained more fully with reference to the non-limiting embodiments that are illustrated in the accompanying drawings and detailed in the following description. Descriptions of well-known starting materials, processing techniques, components and equipment are omitted so as not to unnecessarily obscure embodiments in detail. It should be understood, however, that the detailed description and the specific examples, while indicating preferred embodiments, are given by way of illustration only and not by way of limitation. Various substitutions, modifications, additions and/or rearrangements within the spirit and/or scope of the underlying inventive concept will become apparent to those skilled in the art from this disclosure.

As used herein, the terms "comprises," "comprising," "includes," "including," "has," "having" or any other variation thereof, are intended to cover a non-exclusive inclusion. For example, a process, article, or apparatus that comprises a list of elements is not necessarily limited to only those elements but may include other elements not expressly listed or inherent to such process, article, or apparatus.

Additionally, any examples or illustrations given herein are not to be regarded in any way as restrictions on, limits to, or express definitions of, any term or terms with which they are utilized. Instead, these examples or illustrations are to be regarded as being described with respect to one particular embodiment and as illustrative only. Those of ordinary skill in the art will appreciate that any term or terms with which these examples or illustrations are utilized will encompass other embodiments which may or may not be given therewith or elsewhere in the specification and all such embodiments are intended to be included within the scope of that term or terms.

In the foregoing specification, the invention has been described with reference to specific embodiments. However, one of ordinary skill in the art appreciates that various modifications and changes can be made without departing from the scope of the invention. Accordingly, the specification and figures are to be regarded in an illustrative rather than a restrictive sense, and all such modifications are intended to be included within the scope of invention.

Although the invention has been described with respect to specific embodiments thereof, these embodiments are merely illustrative, and not restrictive of the invention. The description herein of illustrated embodiments of the invention is not intended to be exhaustive or to limit the invention to the precise forms disclosed herein (and in particular, the inclusion of any particular embodiment, feature or function is not intended to limit the scope of the invention to such embodiment, feature or function). Rather, the description is intended to describe illustrative embodiments, features and functions in order to provide a person of ordinary skill in the art context to understand the invention without limiting the invention to any particularly described embodiment, feature or function. While specific embodiments of, and examples for, the invention are described herein for illustrative purposes only, various equivalent modifications are possible within the spirit and scope of the invention, as those skilled in the relevant art will recognize and appreciate. As indicated, these modifications may be made to the invention in light of the foregoing description of illustrated embodiments of the invention and are to be included within the spirit and scope of the invention. Thus, while the invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the invention.

Respective appearances of the phrases "in one embodiment," "in an embodiment," or "in a specific embodiment" or similar terminology in various places throughout this specification are not necessarily referring to the same embodiment. Furthermore, the particular features, structures, or characteristics of any particular embodiment may be combined in any suitable manner with one or more other embodiments. It is to be understood that other variations and modifications of the embodiments described and illustrated herein are possible in light of the teachings herein and are to be considered as part of the spirit and scope of the invention.

In the description herein, numerous specific details are provided, such as examples of components and/or methods, to provide a thorough understanding of embodiments of the invention. One skilled in the relevant art will recognize, however, that an embodiment may be able to be practiced without one or more of the specific details, or with other apparatus, systems, assemblies, methods, components, materials, parts, and/or the like. In other instances, well-known structures, components, systems, materials, or operations are not specifically shown or described in detail to avoid obscuring aspects of embodiments of the invention. While the invention may be illustrated by using a particular embodiment, this is not and does not limit the invention to any particular embodiment and a person of ordinary skill in the art will recognize that additional embodiments are readily understandable and are a part of this invention.

It will also be appreciated that one or more of the elements depicted in the drawings/figures can also be implemented in a more separated or integrated manner, or even removed or rendered as inoperable in certain cases, as is useful in accordance with a particular application.

Benefits, other advantages, and solutions to problems have been described above with regard to specific embodiments. However, the benefits, advantages, solutions to problems, and any component(s) that may cause any benefit, advantage, or solution to occur or become more pronounced are not to be construed as a critical, required, or essential feature or component.

What is claimed is:

1. A 3-phase group modular metering system, with a 3-phase four main cross bus A, B, C and N configuration to distribute 3-phase four wire power to a single-phase three main cross bus A1, B1 and N1 configuration as single-phase three wire power, the system comprising:
- a 3-phase main connection module;
- at least one or more single-phase in to single-phase out metering module stacks;
- a 3-phase metering module stack; and
- a connection joint disposed between the 3-phase main connection module and the at least one or more single-phase in to single-phase out metering module stacks to derive the 3-phase four main cross bus A, B, C and N configuration into the single-phase three main cross bus of A1, B1 and N1 configuration for distributing power in single-phase through the single-phase three main cross bus of A1, B1 and N1 configuration by deriving (A, B, N) or (A, C, N) or (B, C, N) combination,
- wherein the connection joint derives the 3-phase four main cross bus A, B, C and N configuration into the single-phase three main cross bus of A1, B1 and N1 configuration by connecting the 3-phase four main cross bus A, B, C and N, and
- wherein the connection joint is in a disc form and connects to A, B and N of the 3-phase four main cross bus A, B, C and N configuration into the single-phase three main cross bus of A1, B1 and N1 configuration.

2. The system of claim 1, wherein the 3-phase main connection module is either a tap box or a main service disconnect, the 3-phase main connection module accepts a 3-phase 4 wire or 3-phase busway to provide the 3-phase four main cross bus A, B, C and N configuration.

3. The system of claim 1, wherein the at least one or more single-phase in to single-phase out metering module stacks has the single-phase three main cross bus of A1, B1 and N1 configuration.

4. A 3-phase group modular metering system, with a 3-phase four main cross bus A, B, C and N configuration to distribute 3-phase four wire power to a single-phase three main cross bus A1, B1 and N1 configuration as single-phase three wire power, the system comprising:
- a 3-phase main connection module;
- at least one or more single-phase in to single-phase out metering module stacks;
- a 3-phase metering module stack; and
- a connection joint disposed between the 3-phase main connection module and the at least one or more single-phase in to single-phase out metering module stacks to derive the 3-phase four main cross bus A, B, C and N configuration into the single-phase three main cross bus of A1, B1 and N1 configuration for distributing power in single-phase through the single-phase three main cross bus of A1, B1 and N1 configuration by deriving (A, B, N) or (A, C, N) or (B, C, N) combination,
- wherein the connection joint derives the 3-phase four main cross bus A, B, C and N configuration into the single-phase three main cross bus of A1, B1 and N1 configuration by connecting the 3-phase four main cross bus A, B, C and N, and
- wherein the connection joint is in a disc form and connects to A, C and N of the 3-phase four main cross bus A, B, C and N configuration into the single-phase three main cross bus of A1, B1 and N1 configuration.

5. The system of claim 4, wherein the 3-phase main connection module is either a tap box or a main service disconnect, the 3-phase main connection module accepts a 3-phase 4 wire or 3-phase busway to provide the 3-phase four main cross bus A, B, C and N configuration.

6. The system of claim 4, wherein the at least one or more single-phase in to single-phase out metering module stacks has the single-phase three main cross bus of A1, B1 and N1 configuration.

7. A 3-phase group modular metering system, with a 3-phase four main cross bus A, B, C and N configuration to distribute 3-phase four wire power to a single-phase three main cross bus A1, B1 and N1 configuration as single-phase three wire power, the system comprising:
- a 3-phase main connection module;
- at least one or more single-phase in to single-phase out metering module stacks;
- a 3-phase metering module stack; and
- a connection joint disposed between the 3-phase main connection module and the at least one or more single-phase in to single-phase out metering module stacks to derive the 3-phase four main cross bus A, B, C and N configuration into the single-phase three main cross bus of A1, B1 and N1 configuration for distributing power in single-phase through the single-phase three main cross bus of A1, B1 and N1 configuration by deriving (A, B, N) or (A, C, N) or (B, C, N) combination,
- wherein the 3-phase main connection module is either a tap box or a main service disconnect, the 3-phase main connection module accepts a 3-phase 4 wire or 3-phase busway to provide the 3-phase four main cross bus A, B, C and N configuration, and
- wherein the at least one or more single-phase in to single-phase out metering module stacks has the single-phase three main cross bus of A1, B1 and N1 configuration.

8. The system of claim 7, wherein the connection joint derives the 3-phase four main cross bus A, B, C and N configuration into the single-phase three main cross bus of A1, B1 and N1 configuration by connecting the 3-phase four main cross bus A, B, C and N.

9. The system of claim 8, wherein the connection joint is in a disc form and connects to A, B and N of the 3-phase four main cross bus A, B, C and N configuration into the single-phase three main cross bus of A1, B1 and N1 configuration.

10. The system of claim 8, wherein the connection joint is in a disc form and connects to A, C and N of the 3-phase four main cross bus A, B, C and N configuration into the single-phase three main cross bus of A1, B1 and N1 configuration.

* * * * *